United States Patent
Van Zijl et al.

(10) Patent No.: US 6,943,033 B2
(45) Date of Patent: Sep. 13, 2005

(54) MAGNETIC RESONANCE METHOD FOR ASSESING AMIDE PROTON TRANSFER EFFECTS BETWEEN AMIDE PROTONS OF ENDOGENOUS MOBILE PROTEINS AND PEPTIDES AND TISSUE WATER IN SITU AND ITS USE FOR IMAGING PH AND MOBILE PROTEIN/PEPTIDE CONTENT

(75) Inventors: Peter C. M. Van Zijl, Ellicott City, MD (US); Jinyuan Zhou, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 10/319,864

(22) Filed: Dec. 13, 2002

(65) Prior Publication Data

US 2003/0160610 A1 Aug. 28, 2003

Related U.S. Application Data

(60) Provisional application No. 60/339,666, filed on Dec. 13, 2001.

(51) Int. Cl.$^7$ .......................... G01N 24/00; A61B 6/00
(52) U.S. Cl. ...................... 436/173; 600/410; 600/416; 600/456
(58) Field of Search ................................. 600/458, 410, 600/416; 436/173

(56) References Cited

PUBLICATIONS

Guivel–Scharen et al. "Detection of Proton Chemical Exchange Between Metabolites and Water in Biological Tissues", J. Magn. Reson., 1998, v. 133, pp. 36–45.*
Moon et al. "Determination of Intracelluair pH by 31P Magnetic Resonance", J. Biol. Chem., 1973, v. 248, No. 20, pp. 7276–727.*

Kato, et al., "Alterations in brain phosphorous metabolism in Bi polar disorder detected by in vivo $^{31}$P and $^7$Li magnetic resonance spectroscopy", J. Affect Disorder Jan. 1993; 27(1):53–9.

Mori, et al., "Proton NMR spectroscopy of solvent–saturable resonances: a new approach to study pH effects in situ", Magnetic Resonance in Medicine (1998), 40(1), 36–42.

Ward, et al., "Determination of pH Using Water Protons and Chemical Exchange Dependent Saturation Transfer (CEST)", Magnetic Resonance in Medicine 44:799–802 (2000).

Goffeney, et al., "Sensitive NMR Detection of Cationic–Polymer–Based Gene Delivery Systems Using Saturation Transfer via Proton Exchange", J. Am. Chem. Soc. 2001, 123, 8628–8629.

* cited by examiner

*Primary Examiner*—Yelena G. Gakh
(74) *Attorney, Agent, or Firm*—Peter F. Corless; William J. Daley, Jr.; Edwards & Angell, LLP

(57) ABSTRACT

Featured is an MRI/NMR methodology or process to detect amide protons of endogenous mobile proteins and peptides via the water signal. Such methods and processes can be used for the purposes of detection of pH effects and labile amide proton content of mobile proteins/peptides or content changes thereto using MRI Also featured are methods whereby assessment of determined pH effects and amide proton content or content changes and related mobile protein and/or peptide content or content changes can be used in connection with diagnosis, program and treatment of brain related disorders and diseases, cardiac disorders and diseases, and cancer and to use such methods for monitoring, detecting and assessing protein and peptide content in vivo and pathologically for any of a number of diseases or disorders of a human body, including but not limited to cancers, ischemia, Alzheimers and Parkinsons.

43 Claims, 15 Drawing Sheets

US 6,943,033 B2

MAGNETIC RESONANCE METHOD FOR ASSESING AMIDE PROTON TRANSFER EFFECTS BETWEEN AMIDE PROTONS OF ENDOGENOUS MOBILE PROTEINS AND PEPTIDES AND TISSUE WATER IN SITU AND ITS USE FOR IMAGING PH AND MOBILE PROTEIN/PEPTIDE CONTENT

This application claims the benefit of U.S. Provisional Application Ser. No. 60/339,666 filed Dec. 13, 2001, the teachings of which are incorporated herein by reference.

STATEMENT REGARDING FEDERALLY-SPONSORED RESEARCH

Funding for the present invention was provided in part by the Government of the United States by virtue of Grant No. NIH/NINDS (NS31490). Thus, the Government of the United States has certain rights in and to the invention claimed herein.

FIELD OF INVENTION

The present invention generally relates to apparatus and methods for magnetic resonance (MR) imaging (MRI), also known as nuclear magnetic resonance (NMR) imaging (NMRI). More particularly the present invention relates to methods for magnetic resonance imaging and spectroscopy relating to exchange of magnetization between protons and more specifically methods for detecting, assessing and imaging pH effects as well as amide proton content using the water signal. The present invention also features MRI systems, apparatuses and devices related thereto

BACKGROUND OF THE INVENTION

Magnetic resonance imaging (MRI) is a technique that is capable of providing three-dimensional imaging of an object. A conventional MRI system typically includes a main or primary magnet that provides the main static magnetic field $B_o$, magnetic field gradient coils and radio frequency (RF) coils, which are used for spatial encoding, exciting and detecting the nuclei for imaging. Typically, the main magnet is designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,689,563; 4,968,937 and 5,990,681, the teachings of which are incorporated herein by reference, some exemplary MRI systems.

In MRI, high-resolution information is obtained on liquids such as intracellular or extra-cellular fluid, tumors such as benign or malignant tumors, inflammatory tissues such as muscles and the like through the medium of a nuclear magnetic resonance (NMR) signal of a nuclear magnetic resonance substance such a proton, fluorine, magnesium, phosphorous, sodium, calcium or the like found in the area (e.g., organ, muscle, etc.) of interest. In addition to being a non-invasive technique, the MRI images contain chemical information in addition to the morphological information, which can provide physiological information.

Most clinical uses of MRI of biological tissue, however, employ the water content and water relaxation properties to image anatomy and function with micro-liter resolution. The relaxation properties of water ($^1$H nuclei) are the basis for most of the contrast obtained by NMR imaging techniques. Conventional $^1$H NMR images of biological tissues usually reflect a combination of spin-lattice (T1) and spin-spin (T2) water $^1$H relaxation. The variations in water $^1$H relaxation rate generate image contrast between different tissue and pathologies depending upon how the NMR image is collected.

With MRI based on $^1$H water relaxation properties, the system typically detects signals from mobile protons ($^1$H) that have sufficiently long T2 relaxation times so that spatial encoding gradients can be played out between excitation and acquisition before the signal has completely decayed. The T2-values of less mobile protons associated with immobile macromolecules (including solid-like bound cellular proteins) and membranes in biological tissues are too short (e.g., less than 1 ms) to be detected directly in the MRI process.

As has become known to those skilled in the art, however, coupling between the immobile, solid-like macromolecular protons and the mobile or "liquid" protons of water allows the spin state of the macromolecular protons to influence the spin state of the liquid protons through exchange processes. As is known in the art, it is possible to saturate the spins of the immobile, solid-like macromolecular protons ("immobile macromolecular spins") preferentially using an off-resonance radio frequency (RF) pulse. The immobile macromolecular spins have a much broader absorption lineshape than the spins of the liquid protons ("liquid spins"), making them as much as $10^6$ times more sensitive to an appropriately placed off-resonance RF irradiation, as illustrated in FIG. 1. This saturation of the immobile, solid-like macromolecular spins can be transferred to the liquid spins, depending upon the rate of exchange between the two spin populations, and hence is detectable with MRI. This process also is typically referred to as magnetization transfer (MT) process. See also Magnetization Transfer in MRI: A Review; R. M. Henkelman, G. J. Stanisz and S. J. Graham; NMR Biomed 14, 57–64 (2001), the teachings of which are incorporated herein by reference in its entirety and U.S. Pat. No. 5,050,609, the teachings of which also are incorporated herein by reference in its entirety.

Magnetization transfer is more than just a probe into the proton spin interactions within tissues as it also provides a mechanism that can be used to provide additional advantageous contrast in MR images. One application for use of the magnetization technique is in magnetic resonance angiography (MRA). In MRA specific imaging sequences are used to suppress the signal from static tissues while enhancing signal from blood by means of inflow or phase effects. The signal contrast between the blood and other tissue can always be enhanced by using MT (which need not affect blood) to further suppress the background tissue signal. Better contrast between blood and tissue leads to better angiograms.

Another application of MT is characterization of white matter disease in the brain, such as multiple sclerosis (MS) and brain tumors. Multiple sclerosis is a diffuse, progressive disease, grossly characterized by the presence of lesions in brain white matter tissue with pathological characteristics that vary as the lesions evolve. The evolution and history of specific MS lesions is difficult to resolve with conventional T1-weighted or T2-weighted MRI, and so some lesions are unobservable. Using MT imaging for the region of-interest analyses, MS lesions are more conspicuous and the magnetization transfer ratio values provide information on lesion evolution.

More recently, the diffuse characteristics of multiple sclerosis have been characterized by plotting the MTR histogram of the whole brain. This process indicates that there are significant differences between the MTR ratio of the so-called 'normal-appearing white matter' in MS patients and the white matter of healthy individuals. Histogram-based measures of MTR show strong correlation with cognitive decline in MS patients and may provide a useful method to study the natural course of MS or to evaluate the effect of drug treatments.

Other areas of application for MT include, but are not limited to, imaging of the breast, knee, muscle and cartilage. Within cartilage, it may be possible using Gd-DTPA to separate the effect of proteoglycan degradation, from the effect of collagen disruption, which is the major contributor to MT in this tissue.

MRI of acute stroke is becoming an increasingly important procedure for rapid assessment of treatment options. Despite many available MRI modalities, it is presently difficult to assess the viability of the ischemic penumbra (i.e., a zone of reduced flow around the ischemic core). Also, impaired oxygen metabolism and concomitant pH changes are crucial in the progress of the ischemic cascade, however, pH effects cannot be ascertained using the water signal.

As is known to those skilled in the art, phosphorous magnetic resonance spectroscopy (MRS) can be used to assess absolute pH and pH changes, however, this particular technique has low spatial resolution (e.g., 20–30 ml) in part because the strength of the NMR signal from phosphorous is significantly less than that for the water signal. Phosphorous MRS, however, is not available on standard clinical equipment, which as noted above, is limited predominatly to those that use the water proton ($^1H$) signals. Also, given the time constraints usu9ly involved with making timely diagnoses for purposes of treatment, such as for when dealing with acute stroke victims, it is not a practical option or practice to re-configure clinical equipment configured to use the water signal so it can perform phosphorous MRS to assess pH. Thus, measurement of pH and assessment of pH effects cannot be practically performed in connection with the NMR imaging process.

In sum, it has become possible to use the water ($^1H$) signal in MRI for non-invasive assessment of functional and physiological parameters as well as for providing a mechanism for contrasting tissues being imaged. It has not been possible, however, to use this water signal for purposes of imaging pH effects.

Efforts have been undertaken to develop exogenous contrast agents for pH detection via the water resonance. These techniques attempt to indirectly detect exchangeable protons through the water resonance in solution using such contrast agents. Discussions of such techniques are found in NMR Imaging of Labile Proton Exchange, S. Wolff and R. Balaban, JMR 86, p. 164 (1990); Detection of Proton Chemical Exchange Between Metabolites and Water in Biological Tissues, V. Guivel-Scharen, T. Sinnwell, S. D. Wolff and R. S. Balaban, J. Magn Reson 133, 36 (1998); A New Class of Contrast Agents for MRI Based Proton Chemical Exchange Dependent Saturation Transfer (CEST), K. M. Ward, A. H. Aletras and R. S. Balaban, J Magn Reson 143, 79 (2000); and K. M. Ward and R. S. Balaban, Determination of pH Using Water Protons and Chemical Exchange Dependent Saturation Transfer (CEST), Magn Reson Med 44(5): 799 (2000).

In the article entitled Detection of Proton Chemical Exchange Between Metabolites and Water in Biological Tissues, it is suggested that small endogenous metabolites with exchangeable protons can be used for pH detection, while the marcomolecule solid-like phase cannot be so used. Further, the article includes no discussion or suggestion of the use of mobile proteins/peptides for this purpose as well. As to the article entitle, Determination of pH Using Water Protons and Chemical Exchange Dependent Saturation Transfer (CEST), the discussion describes or relates to the exogenous agents being given to the subject.

In addition to the foregoing, there is found in Sensitive Detection of Solvent-Saturable Resonances by Proton NMR Spectroscopy in Situ; A New Approach to study pH Effects, S. Mori, et al., Magn Reson Med 40, 36 (1998), the use of exchangeable protons for studying pH in vivo. This document shows such a use with spectroscopy but not through detection with and/or using the water signal. There also have been other studies undertaken that involve the study of proton-like spectra in vivo using chemical shifts but these studies also were not based on detection through the use of the water signal.

Mobile cellular proteins and peptides are some of the building blocks of cells. The cellular content and amide proton exchange properties of these endogenous proteins and peptides may change dramatically during ischemia and in cancer and many other pathologies. Although papers have pointed to the presence of mobile proteins in NMR spectra, there are presently no practical MRI approaches to selectively detect mobile proteins and peptides because of interference with bound metabolites, more rigid-like proteins and other slow-moving macromolecules.

It thus would be desirable to provide MRI methods to detect mobile proteins and peptides using the water signal. In addition, it would be desirable to monitor pH, to detect pH changes, and to assess associated effects using the water signal. It would be particularly desirable to provide magnetic resonance imaging methods that would produce pH sensitive MRI contrast by exploiting for example the magnetization exchange between water protons and the labile amide protons of endogenous mobile cellular proteins and peptides. It also would be desirable to provide MRI methods that would provide a mechanism to monitor, detect and assess mobile protein and peptide content using the amide protons. Further, it would be desirable to use such methods for monitoring, detecting and assessing pH and labile amide proton content in connection with treatment of brain related disorders and diseases, cardiac disorders and diseases, and cancer and to use such methods for monitoring, detecting and assessing pH as well as mobile protein and peptide content in vivo and pathologically for any of a number of diseases or disorders of a human body, including but not limited to cancers, ischemia, Alzheimers and Parkinsons.

SUMMARY OF THE INVENTION

The present invention features an MRI/NMR methodology or process to dectect labile amide protons of endogenous mobile proteins and peptides via the water signal. Such methods and processes can be used for the purposes of detection of pH effects and labile amide proton content and related mobile protein and peptide content using MR imaging. Also featured are methods whereby assessment of determined pH effects and labile amide proton content and related mobile protein and peptide content can be used in connection with treatment of brain related disorders and diseases, cardiac disorders and diseases, and cancer and to use such methods for monitoring, detecting and assessing pH and protein and peptide content in vivo and pathologically for any of a number of diseases or disorders of a human body, including but not limited to cancers, ischemia, Alzheimers and Parkinsons.

According to an aspect of the present invention, there is featured a method for determining an effect of labile amide proton content and properties in tissue on a water signal as measured by one of MRI or NMR spectroscopy or spectroscopic imaging. Such a method includes irradiating a pool of amide protons of endogenous mobile proteins and peptides that is in exchange with another pool of water protons to label the amide protons of said pool of amide protons and measuring the effect on the water protons the amide protons are in exchange with, and determining an amide proton transfer ratio corresponding to the transfer of saturation between said pool of amide protons and said another pool of water protons. Such a method also includes determining labile amide proton content from the signal intensity and/or, cellular pH or pH effects from the determined amide proton transfer ratio and/or changes therein as reflected in the amount of signal transferred. The amide proton transfer ratio as hereinafter described depends on amide content (intensity) and on the amide proton exchange rate and on the tissue water concentration.

As indicated above, the amide protons are those of mobile proteins and peptides and said another pool of protons they are in exchange with comprises water protons. The step of irradiating further includes irradiating the amide protons at a resonance in a proton spectrum of these amide protons, more particularly, irradiating the amide protons with electromagnetic radiation at about a 8.3 ppm resonance in a proton spectrum of the amide protons, more specifically irradiating the amide protons with electromagnetic radiation around a 8.3 ppm resonance in a proton spectrum of the amide protons. This also includes a range of about ±3–4 ppm surrounding the main amide resonance, where other amide resonances of mobile spectral components may resonate.

In further embodiments, such a method further includes establishing a relationship between proton transfer ratio and/or intensity of amide protons and said one of amide proton content, tissue pH or pH effects; more particularly establishing an empirical relationship between the proton transfer ratio of labile amide protons and said one of amide proton content, tissue pH or pH effects.

In an exemplary embodiment, said establishing an empirical relationship includes establishing an empirical quantitative or qualitative relationship between the amide proton transfer ratio and/or intensity of amide protons and pH including: irradiating a first pool including amide protons, that is in exchange with a second pool of water protons, with sufficient electromagnetic radiation to label the amide protons of said first pool, determining a given amide proton transfer ratio corresponding to the transfer of saturation between said first pool of amide protons and said second pool of water protons and performing a phosphorus spectroscopy to determine a cellular pH value corresponding to the determined amide proton transfer rate. Said irradiating, determining and performing is repeated so as to generate a plurality of pH values corresponding to respective determined amide proton transfer ratios. Whereby the empirical relationship is created using the generated plurality of pH values corresponding to respective determined amide proton transfer ratios.

According to another aspect of the present invention there is featured a method for magnetic resonance imaging including acquiring MR image data of a region (i.e., spatial region) of interest. Such a method also includes assessing one of labile amide proton content, protein/peptide content or pH of pH effects of the region of interest using a $^1$H saturation transfer technique, and adjusting the contrast of the acquired MR image data based on said assessing of said one of labile amide proton content, protein/peptide content or pH. In this way, the adjusted acquired MR image data reflects relative differences of said one of amide proton content, protein/peptide content or pH within the region of interest. In addition, the method further includes generating images based on the adjusted acquired MR image data.

In further embodiments, said assessing includes irradiating a pool, more particularly an endogenous pool of amide protons of mobile proteins/peptides in the region of interest (i.e., spatial region) that is in exchange with another pool of water protons in the region of interest with sufficient electromagnetic radiation to label the amide protons of said pool of amide protons. Further included is assessing said one of labile amide proton content, protein/peptide content or pH based on transfer of saturation between said pool, more particularly said endogenous pool of amide protons and said another pool of water protons.

In more particular embodiments said assessing includes irradiating said pool of amide protons in the region of interest that is in exchange with another pool of water protons in the region of interest with sufficient electromagnetic radiation to magnetically label said pool of amide protons, determining a given amide proton transfer effect corresponding to the transfer of saturation between said pool of amide protons and said another pool of water protons; and assessing said one of labile amide proton content, protein/peptide content or pH or pH effects based on the determined given amide proton transfer effect. In more specific embodiments, the amide proton transfer effect manifests itself as one of an amide proton transfer ratio and/or a change in water proton intensity.

According to yet another aspect of the present invention, there is featured a method of NMR/MRI including acquiring MRI image data that includes placing one of a sample or subject of interest in an MRI scanner, selectively exciting MR signal in at least one region (i.e., spatial region) of said sample or subject, and detecting signals from said region to generate image data. Such a method also includes assessing one of amide proton content, protein/peptide content or pH/pH effects of said at least one region of said sample or subject using a $^1$H saturation transfer technique, and adjusting the generated MRI image data based on said assessing so the adjusted generated MRI image data reflects relative differences of said one of amide proton content, protein/peptide content or pH within said at least one region.

In further embodiments, said assessing includes irradiating a pool, more particularly an endogenous pool, of amide protons of mobile protons/peptides in said at least one region of said sample or subject that is in exchange with another pool of water protons in said at least one region of said sample or subject with sufficient electromagnetic radiation to magnetically label the amide protons of said pool of amide protons; and assessing said one of labile amide proton content, protein/peptide content or pH based on transfer of saturation between said pool of amide protons and said another pool of water protons.

In more particular embodiments, such assessing includes irradiating said pool of amide protons in said at least one region of said sample or subject that is in exchange with another pool of water protons in said at least one region of said sample or subject with sufficient electromagnetic radiation to magnetically label said pool of amide protons;

determining a given amide proton transfer effect corresponding to the transfer of saturation between said pool of amide protons and said another pool of water protons; and assessing effects of one of labile amide proton content, protein/peptide content or pH based on the determined given amide proton transfer effect. In more specific embodiments, the amide proton transfer effect manifests itself as one of an amide proton transfer ratio or an intensity signal of the water protons. In further embodiments, said adjusting includes adjusting the contrast of the generated MRI image data based on said assessing of one of labile amide proton content, protein/peptide content or pH so the adjusted MRI image data reflects the relative differences in said one of amide proton content, protein/peptide content or pH.

According to yet further aspects of the present invention there are feature a method for relating amide proton exchange properties to cellular pH or pH changes, a method for relating an amide proton transfer based water signal and signal changes to protein and peptide content and a method for imaging labile amide proton content and properties via exchange relationship of amide protons with the water signal.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein.

DESCRIPTION OF THE PREFERRED EMBODIMENT

According to the present invention there is featured a process or methodology for assessing the exchange properties and concentration (content) of mobile cellular proteins/tissues and peptides present endogenously in the body having exchangeable protons, more particularly, a process or methodology for assessing the exchange properties and concentration (content) of labile amide protons of endogenous mobile proteins and peptides, in the body. According to various aspects of the present invention, such a method can be used to determine pH and assess pH effects and to assess content and/or changes in content of mobile proteins and peptides using information based on nuclear magnetic resonance signals of water as well as MRI contrast based on this water signal and influenced by the magnetization exchange between water and the above-mentioned amide protons. Before describing the present invention, the following briefly and generally describes the magnetization transfer process, where reference also should be made to U.S. Pat. No. 5,050,609 and to Magnetization Transfer in MRI: A Review infra, for further details or description of the magnetization transfer process.

As indicated herein, coupling between the immobile, solid-like macromolecular protons and the mobile or "liquid" protons allows the spin state of the immobile macromoecular protons to influence the spins state of the liquid protons (e.g., water) through exchange process. As is known in the art, it is possible to saturate the immobile macromolecular spins preferentially using an off-resonance radio frequency (RF) pulse. Such saturation also is referred to as magnetically labeling of the protons of solide like macromolecules that are often just called macromolecular protons. The immobile macromolecular spins have a much broader absorption lineshape than the liquid spins, making them as much as $10^6$ times more sensitive to an appropriately placed off-resonance RF irradiation. This saturation of the solid-like macromolecular spins is transferred to the liquid spins (water), depending upon the rate of exchange between the two spin populations, and hence is detectable with MRI.

Figure 2:
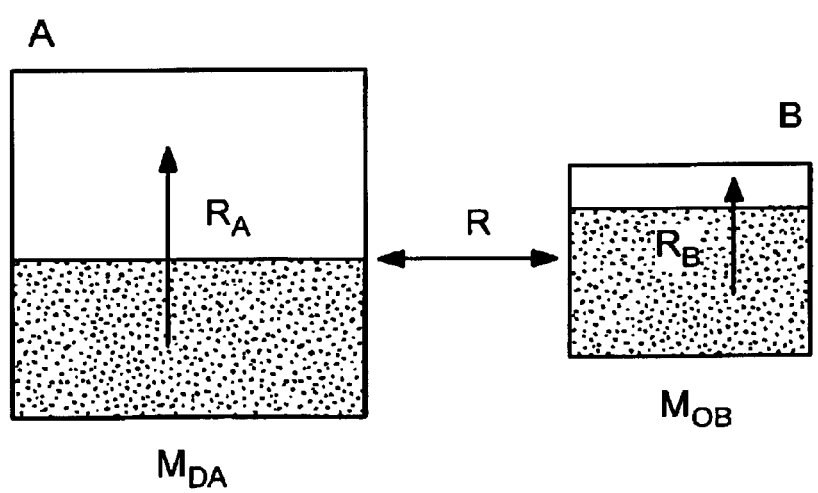
FIG. 2 is a two-pool model of the magnetization transfer process.

There is shown in FIG. 2, a two-pool model that provides a quantitative interpretation of such magnetization or saturation transfer. Pool A represents the liquid spins, where the number of spins in this compartment is by convention normalized to unity ($M_{OA}=1$), and Pool B represents the solide-like/immobile macromolecular spins. In tissues, the number of immobile macromolecular spins is much less than the liquid spins and the relative fraction given by $M_{OB}$. In each pool, and at any instant in time, some of the spins are in the longitudinal orientation represented by the upper unshaded portion of the compartment and some spins are saturated, represented by the lower shaded portion. The partition into longitudinal spins and saturated spins depends upon the irradiation history. When the irradiation is turned off, the time-dependent changes in the model are represented by rate constants, the longitudinal relaxation rates of pools A and B ($R_A$ and $R_B$, respectively), the exchange rate from Pool A to Pool B ($RM_{OB}$) and the exchange rate from Pool B to Pool A (R).

Figure 1:
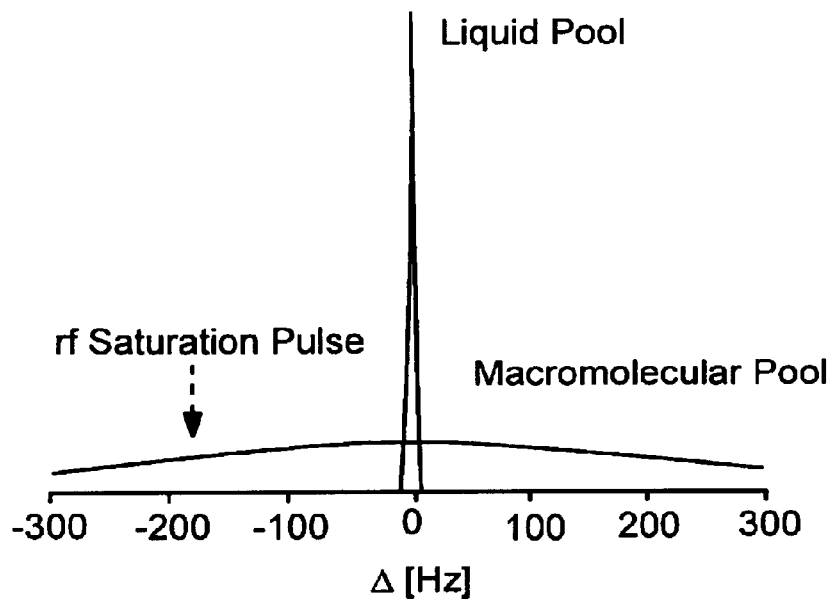
FIG. 1 illustrates the absorption line shapes for the protons in the solid-like macromolecular pool of interest in conventional magnetization transfer (MT) MRI and the liquid pool (water), where the spectrum is obtained after irradiating the solid-like macromolecular pool as a function of frequency offset and measuring water intensity.

In Pool B, the protons in the solid-like macromolecules are strongly coupled to each other resulting in a homogenously broadened absorption lineshape as is shown in FIG. 1. Thus, the off-resonance irradiation results in progressive saturation of the spins that make-up Pool B. In contrast, the spins making up Pool A are weakly coupled due to motional narrowing. Although the intent with magnetization transfer is to manipulate the spins of the liquid pool indirectly by means of the saturating the immobile macromolecular pool, some direct saturation of the liquid pool in Pool A is inevitable, which is generally described by the Bloch equations.

As indicated herein, the most important process in magnetization transfer is the exchange between the immobile macromolecular pool, Pool B, and the liquid pool, Pool A. It is this exchange that transfers the saturation or magnetization of the macromolecular protons to the protons comprising the liquid pool, which results in decreased longitudinal magnetization being available for imaging.

According to one aspect of the present invention there is featured a method or process for MR imaging that detects the effects of amide proton properties, pH and/or mobile protein and/or peptide content changes on the intensity of the water signal in MRI. More particularly, according to the methodology and process of the present invention, the narrow amide proton resonance range of endogenous mobile intracellular proteins and peptides is selectively irradiated and saturated. The saturation is subsequently transferred to the water ($^1H$) protons as with the $^1H$ magnetization transfer process.

More specifically, the main amide proton resonance of endogenous cellular mobile proteins and/or peptides centered 8.3 ppm in the proton NMR spectrum for amide protons is selectively irradiated and saturated. Thereafter, using known MR imaging or spectroscopy techniques (e.g., applying magnetic field gradients to spatially resolve the NMR signal intensity of the saturation transferred to the water protons) NMR data is obtained from such a signal(s) and such data is recorded for evaluation and assessment. It more particular embodiments, in accordance with the methodology of the present invention, the limited frequency range for mobile spectral macromolecular components (e.g., range of about 5–6 ppm wide, corresponding to about 300–360 Hz wide at 1.5 Telsa, about 600–720 Hz wide at 3 Telsa, etc.) is evaluated and assessed. This is different from the methodology of conventional MT that looks at a wide frequency range (e.g., several tens—hundreds of kHz) for the immobile, solid like components. In the procedure outlined, to determine the amide-proton transfer effect, the effect of conventional MT is removed and/or assessed so as to not be included or not to dominate.

Thereafter, an assessment is made from the recorded data as to the effect of the saturated amide protons on the water signal. From this assessment a determination also is made as to endogenous mobile protein and/or peptide content/concentration and/or the pH of the cells comprising the source of the magnitude of the transfer effect from the saturated amide protons. In more particular embodiments, the method or process includes making a determination from the recorded data as to the amide proton transfer effect being exhibited and, based on the determined amide proton transfer effect, making a determination as to the endogenous mobile protein content/concentration and/or the pH of the cells comprising the source of the magnitude of the transfer effect from the saturated amide protons.

In more specific embodiments, the method or process of the present invention further includes establishing a relationship between amide proton transfer effect and the characteristic, for example pH, to be determined and using the relationship in combination with the determined amide proton transfer effect, making a determination as to the endogenous mobile protein and/or peptide content/concentration and/or the pH of the cells comprising the source of the saturated amide protons. In more particular embodiments, the amide proton transfer effect manifests itself in the form of one or an amide proton transfer ratio and/or a signal intensity of the water protons. In addition, in the methodology of the present invention, the effect of conventional MT is eliminated or removed by assessing MT asymmetry at the particular amide proton resonance frequency and signal changes on top of this asymmetry.

According to another aspect of the present invention there is featured a method or process for magnetic resonance imaging where the spatial information comprising the image data is obtained by combining the methodology or process for MR imaging that detects the effects, more particularly the relative effects, of labile amide content and/or pH and/or mobile protein and peptide content and/or content changes on the intensity of the water signal in MRI along with any water imaging (MRI) approach and any spectroscopic imaging methodology (e.g., one-dimensional and/or multi-directional phase encoding with pulsed field gradients). In this way, the image data is adjusted so as to further reflect at least the relative effects or differences of labile amide proton content or pH or mobile protein and peptide content changes of the tissues and/or bodily fluids being imaged. Stated another way, the contrast of the image data is adjusted or modified so as to further reflect at least the relative effects or differences of labile amide proton content/properties or pH or mobile protein and peptide content changes of the tissues and/or bodily fluid being imaged. Thus, the diagnostic images being generated from the so-adjusted or modified image data so as to provided further contrast between tissues and/or bodily fluids having different labile amide proton content/properties, pH or mobile protein and peptide content changes.

As is known in the art, body tissue that has experienced trauma or infarct, cancerous tissues, whether benign or malignant, or other insult typically has different physiological and chemical characteristics than that or normal tissue that surround the insulted body tissue. Thus, adjusting the contrast for MR images to reflect the relative labile amide proton content and properties, relative pH or relative mobile protein and peptide content of the various tissues or bodily fluids of the region of interest being imaged advantageously enhances the MR imaged being generated so as to provide further contrast between normal tissue and the tissue experiencing the insult.

In more particular embodiments, before or after acquiring the NMR/MR image data using known imaging techniques, the imaging apparatus is configured so as to be capable of selectively irradiating and saturating the amide proton resonance range of endogenous amide protons (e.g., of mobile intracellular proteins and peptides) in the region of interest being imaged. The saturation is subsequently transferred to the water ($^1H$) protons in the region of interest as with the $^1H$ magnetization transfer process. More specifically, the amide proton resonance(s) of endogenous cellular mobile proteins/peptides centered around 8.3 ppm in the proton NMR spectrum for amide protons are selectively irradiated and saturated. Thereafter, using known MR imaging spectroscopy techniques (e.g., applying magnetic field gradients to spatially resolve the NMR signal intensity of the saturation transferred to the water protons) NMR data is obtained from such a signal(s) and such data is recorded for evaluation and assessment.

Thereafter, an assessment is made from the recorded data as to the effect of the saturated amide protons on the water signal. From this assessment a determination also is made as to endogenous labile amide proton content and properties, mobile protein and peptide content/concentration and/or the pH and/or pH changes of the cells comprising the source of the saturated amide protons. In a further embodiment, an assessment is made to determine or establish a relative difference between the endogenous labile amide proton content and properties, mobile protein and peptide content/concentration and/or the pH of the cells of the tissues in the region of interest. For example, the in process values that are representative of the characteristic being determined (e.g., pH) can be normalized (e.g., normalized in absolute terms or with respect to neighboring or contralateral regions) and the normalized values used to adjust the image data or the contrast of the image data.

In another more particular embodiment, the method or process includes making a determination from the recorded data as to the amide proton transfer (APT) effect being exhibited by the various tissues of the region of interest and, based on the determined amide proton transfer effect, determining or establishing the relative difference between the endogenous labile amide proton content and properties, mobile protein and peptide content/concentration and/or the pH. As indicated above, these in process values of amide proton transfer effects can be normalized and the normalized values used to adjust the image data or the contrast of the image data.

In yet another further particular embodiment, the method or process includes making a determination from the recorded data as to the amide proton transfer effects being exhibited and, based on the determined amide proton transfer effect, making a determination as to the endogenous labile amide proton content and properties and/or mobile protein and peptide content/concentration and/or the pH of the cells comprising the source of the saturated amide protons. In more specific embodiments, the method or process of the present invention further includes establishing a relationship between amide proton intensity and/or transfer rates and the sought characteristic, for example, labile amide proton content and/or mobile protein/peptide content and/or pH of the cells or other endogenous units comprising the source or the saturated amide protons. After making such determination as to the endogenous labile amide proton content and properties, mobile protein and peptide content/concentration and/or the pH of the cells, the image data is adjusted, more specifically the contrast of the tissue and/or bodily fluids within the region of interest is adjusted based on the determined endogenous amide proton content and properties, mobile protein and/or peptide content/concentration and/or the pH of the cells.

According to yet another further particular embodiment, the method or process of the present invention further includes establishing a relationship, more specifically an empirical relationship, between an amide proton transfer effect, more specifically between water proton intensity and/or amide proton transfer ratios, and the sought characteristic or property, for example, labile amide proton content and/or mobile protein/peptide content and or pH of the cells or other endogenous units comprising the source of the saturated amide protons. In more specific embodiments, such establishing of a relationship is accomplished in vivo and/or using tissues extracted from the area of interest, for example, brain tissue and muscle tissue.

In an exemplary illustrative embodiment, the sought characteristic is tissue/cellular and/or bodily fluid pH and said establishing a relationship includes establishing an empirical relationship between the amide proton transfer effect of the amide protons and such pH. Such a method is accomplished by irradiating a first pool including amide protons, that is in exchange with a second pool of water protons, with sufficient electromagnetic radiation to label the amide protons of said first pool and determining a given amide proton transfer effect corresponding to the transfer of saturation between said first pool of amide protons and said second pool of protons.

A phosphorus spectroscopy also is performed to determine a cellular pH value corresponding to the determined amide proton transfer ratio. These steps of irradiating, determining and performing the phosphorous spectroscopy are repeated for several physiological conditions so as to generate a plurality of tissue/cellular pH values corresponding to respective determined amide proton transfer ratio; and the empirical relationship is created using the generated plurality of pH values corresponding to respective determined amide proton transfer effects. In more specific embodiments, the amide proton transfer effect comprises an amide proton transfer ratio and the pool of amide protons is from endogenous proteins and peptides in tissues that are in vivo or extracted from the area of interest.

The following examples, further illustrate the various methodologies and processes of the present invention. As these examples are illustrative, the method and process of the present invention shall not be particularly limited to the following examples.

EXAMPLE 1

An in situ rat brain spectroscopy experiment was performed in which the opposite of a typical MT experiment was done. Namely, the water magnetization was selectively labeled and its transfer properties monitored as a function of time after labeling (mixing time tm). In such water exchange (WEX) experiments, the amide protons of proteins and peptides (6–10 ppm) and the aliphatic signals (0–3.5 ppm) from mobile macromolecules (proteins, larger peptides, some lipids) are visible, while those of smaller molecules, such as brain metabolites, are not. On the other hand, the solid-like spectrum of importance in conventional magnetization transfer (MT) imaging experiments is too broad to be detected (120–200 kHz). This experiment illustrates the difference between the properties of protons of mobile marcomolecules versus solid-like macromolecules and small metabolites.

Figures 3A, 3B:
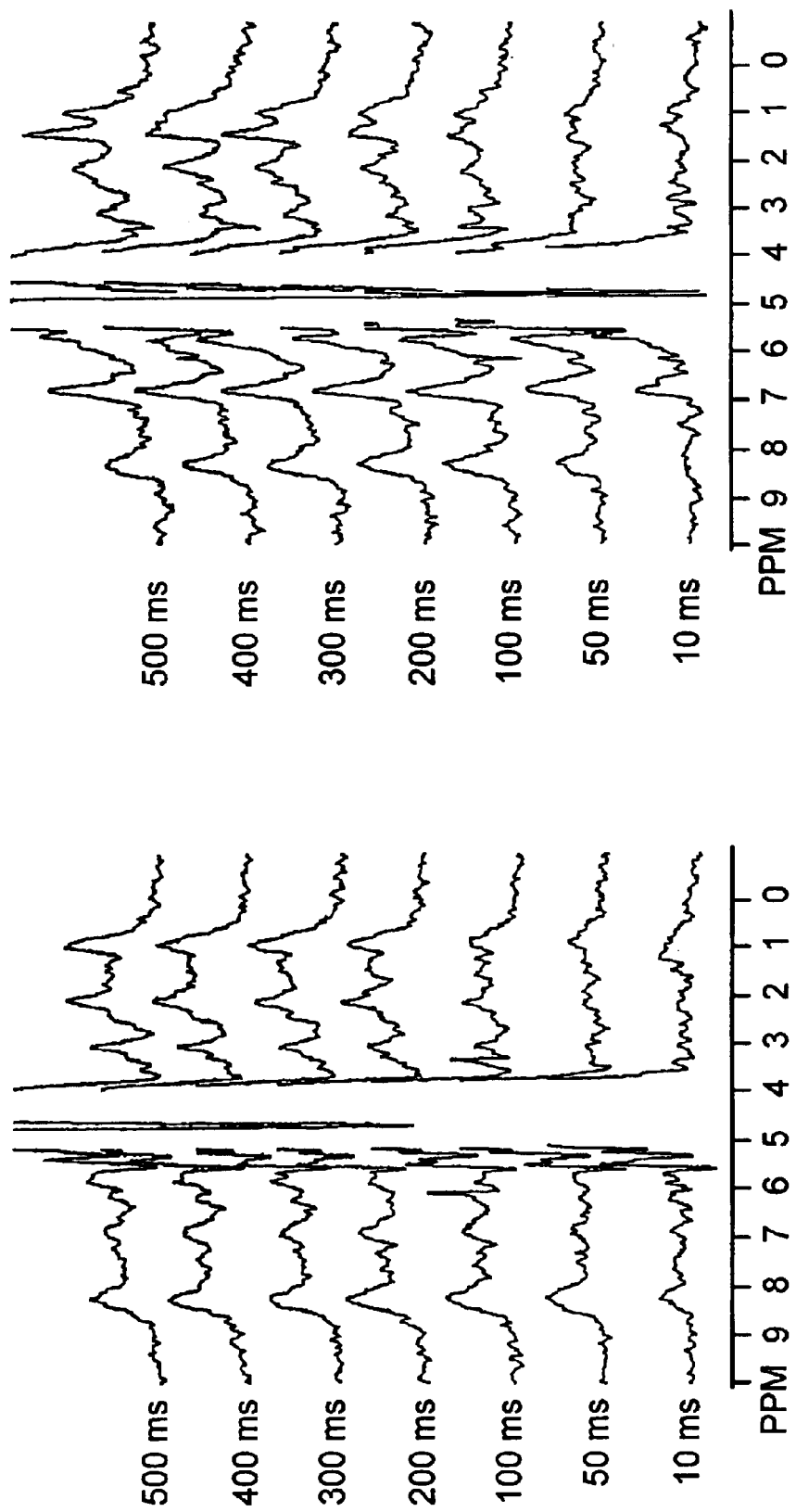
FIGS. 3A,B are, respectively, normocapnic and postmortem water exchange (WEX) spectra for rat brain as a function of time after radio frequency labeling of water magnetization, where the spectrum is obtained is obtained by inverting the water magnification using radio frequency excitation and monitoring the protons of mobile components (metabolities and mobile macromolecules) of the tissue.

Referring to FIGS. 3A,B there is shown normocapnic (3A) and postmortem (3B) water exchange (WEX) spectra for rat brain as a function of time after radiofrequency labeling of water magnetization (mixing time tm). Volume size: $16 \times 12 \times 4$ mm$^3$, set at 4 mm from the top of the brain; spectral width 3000 Hz, 1024 points, 256 scans, TR 4 s, TE 8 ms. The peak at 0.916 ppm was used as a chemical shift reference. Notice the early appearance of the protons around 8.3 ppm (fast exchange transfer) and the subsequent slower label transfer to the (aliphatic) protons at lower frequency, in line with measured effects on proteins/peptides in solution. The resulting aliphatic spectra closely resemble mobile protein/peptide spectra measured in vivo using other methods. Additional evidence of the mobile macromolecular origin comes from the fact that all peaks (except water) decayed quickly with echo time (data not shown). A resonance at 1.3 ppm becomes much more pronounced under postmortem conditions, which resonance is attributed to a mobile lipid component, known to increase during ischemia. As such, the methodology of the present invention is capable of detecting and assessing the effect of the water resonance based exchange-effects between exchangeable protons of mobile lipids and water protons. Although the WEX experiment is not sensitive to lactate, the resonance at 1.3 ppm was verified as not being lactate by going to longer TE (136 ms, where lactate should give an inverted resonance), which showed no signals. Notice that the integrals of the amide proton signals at longer $t_m$ are comparable in viva and postmortem, but the build-up rate of the peak differs. In sum, and as shown in FIGS 3A,B, the in situ WEX spectra at short tm show fast appearance of the resonance at 8.3 ppm, confirming its exchange-related character.

Figure 4:
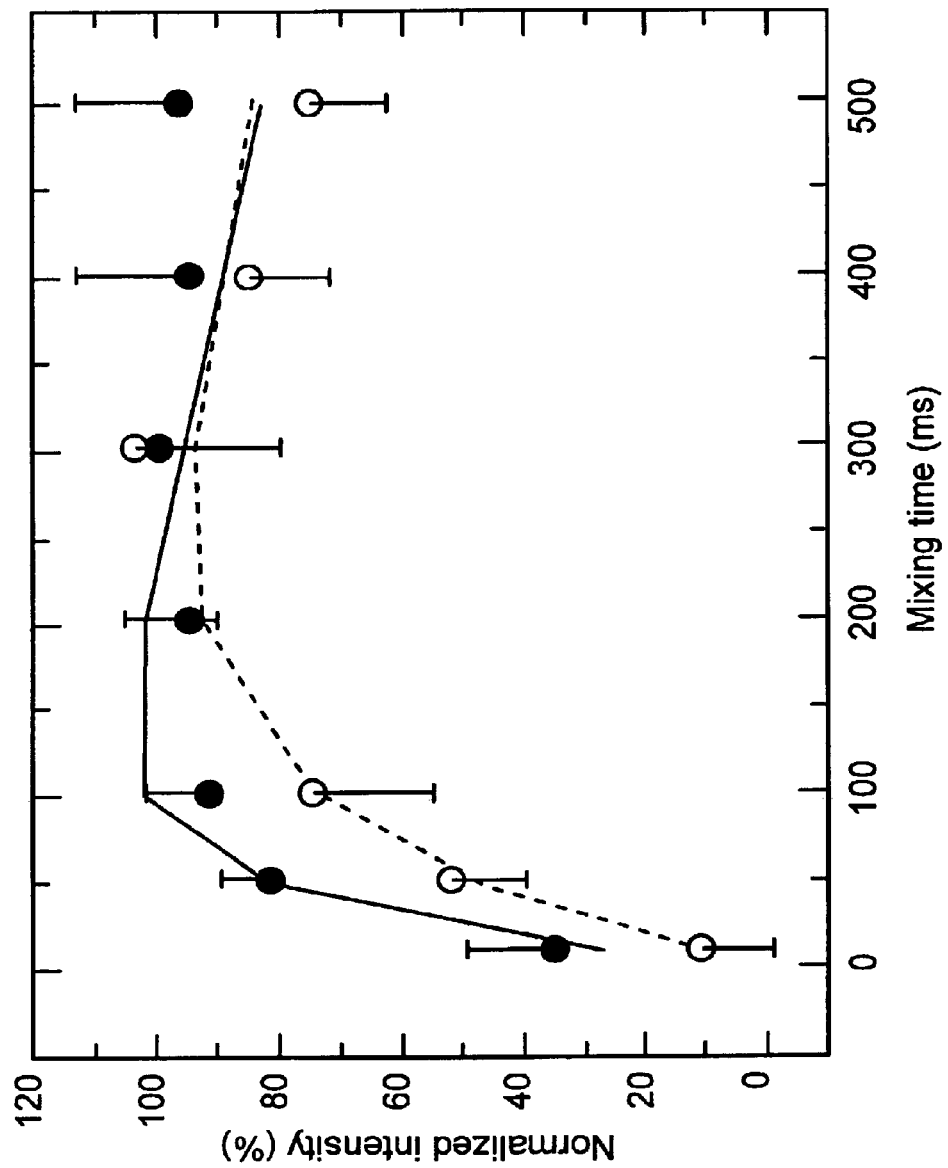
FIG. 4 is a graph illustrating fitting of proton exchange rates using a plot of the average amide proton integrals (n=5) from the WEX spectra of FIGS. 3A,B as a function of mixing time (tm.)

Referring now to FIG. 4, there is shown a graph illustrating fitting of proton exchange rates using a plot of the average amide proton integrals (n=5) from the WEX spectra (See FIG. 3) as a function of mixing time ($t_m$). In the graph, solid circles and solid line represent normocapnia in vivo and the open circles and dashed line represent postmortem. Integrals were normalized to the normocapnic value at $t_m$=300 ms.

The exchange rates were determined by three-parameter fitting to the two-site exchange equation: $S=[S_o k/R_{INH}+k+R_{1w})][exp(-R_{1w} t_m)-exp(-(R_{INH}+k) t_m)]$. This procedure can fit a large range of exchange rates and it is necessary to define constraints. The exchange was assumed to be base-catalyzed exchange and the pH values determined in vivo and postmortem by $^{31}P$ spectroscopy were used to restrict the exchange rate ratio. See also the following discussion regarding pH calibration. In the first fitting iteration, unchanged $S_o$ and $R_{INH}$ were assumed in vivo and postmortem. In the second iteration, equal $S_o$ (the average $S_o$ over all in vivo and postmortem data after normalization and initial fitting) and equal $R_{INH}$ were used for all animals. Exchange rates (k) were 28.6±7.4 s$^{-1}$ and 10.1±2.6 s$^{-1}$ for in vivo and postmortem, respectively. This example illustrates that no change in amide intensity at $t_m$=300 ms was seen in the first two hours postmortem. It thus is concluded that this rate change is due to the pH change upon death.

As shown in FIG. 4, the measured exchange rates, k, are in the typical range for amide protons. At longer tm, signals appear in the aliphatic resonance range (0–4 ppm) at the time scale of a typical intramolecular protein nuclear Overhauser enhancement (NOE) transfer, indicating a substantial mobile protein contribution to the WEX spectra. Furthermore, these aliphatic spectra closely resemble the frequency-dependent shape of mobile protein spectra previously detected in the rat brain using alternative approaches.

Amide Proton Transfer (APT)

The concentration of cellular mobile proteins and peptides is in the millimolar range and detection via the water resonance requires sensitivity enhancement by a factor of 100–1000. This was approached in the inverse way of WEX spectra, by selectively labeling amide protons through radio frequency (RF) irradiation around 8.3 ppm and imaging water after several seconds of transfer. This saturation transfer approach is especially suitable for amide protons, which, contrary to rapidly exchanging SH, OH and amine protons, have a favorable exchange rate range (10–300 s$^{-1}$) that allows selective irradiation under physiological conditions at intermediate magnetic field strength. It is not easy to demonstrate such amide proton transfer (APT) effects on the water signal in tissue, because there are several confounding MRI phenomena. First, there is a large conventional MT effect between solid-like macromolecular structures (often referred to as bound proteins) and cellular water. In addition, blood-oxygen-level-dependent (BOLD) MRI effects occur during physiological adjustments such as hypercapnia, ischemia, or cardiac arrest.

Referring to FIGS. 5A–H there is shown MT (magnetization transfer) spectra, $MTR_{asym}$ spectra (spectra showing the asymmetry in the Magnetization Transfer Ratio with respect to the water frequency), and $\Delta PTR$ spectra (spectra showing the difference in proton transfer ratios) for the rat brain for in situ effects during normocapma, hypercapnia, and cardiac arrest as well as for middle cerebral artery occlusion. MT spectra, or z-spectra, in FIGS. 5A,B show the saturation of the water resonance as a function of RF irradiation frequency with respect to water. Signal attenuation is due mainly to direct water saturation close to the water frequency and the solid-like MT effect over the whole spectral range. The data set was corrected on a pixel by pixel basis for spatial inhomogeneity, which is critical for proper asymmetry analysis of the $MTR_{asym}$ spectra. The small dip at offset 3.5 ppm in FIGS. 5A,B during normocapnia and hypercapnia corresponds to the spectral amide frequency around 8.3 ppm.

To selectively assess APT effects without interference of conventional MT, direct water saturation, and BOLD effects, we used a MT-ratio asymmetry parameter, $MTR_{asym}=S_{sat}/S_o$ (negative offset)$-S_{sat}/S_o$ (positive offset). If MT effects were symmetric with respect to the water resonance, the additional APT should give rise to a positive MT difference.

Figure 5A:
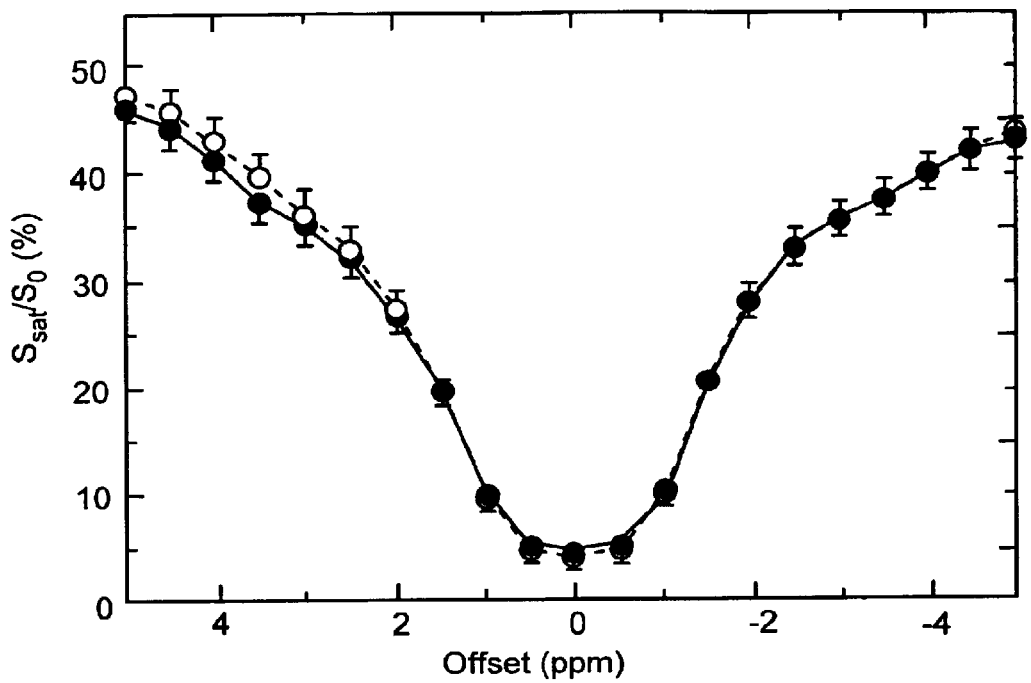
FIGS. 5A–H are various graphs illustrating MT (magnetization transfer) spectra, $MTR_{asym}$ spectra (spectra showing the asymmetry in the Magnetization Transfer Ratio with respect to the water frequency), and $\Delta PTR$ spectra (spectra showing the difference in proton transfer ratios) for the rat brain for in situ effects during normocapnia, hypercapnia, and cardiac arrest as well as for middle cerebral artery occlusion.
Figure 5B:
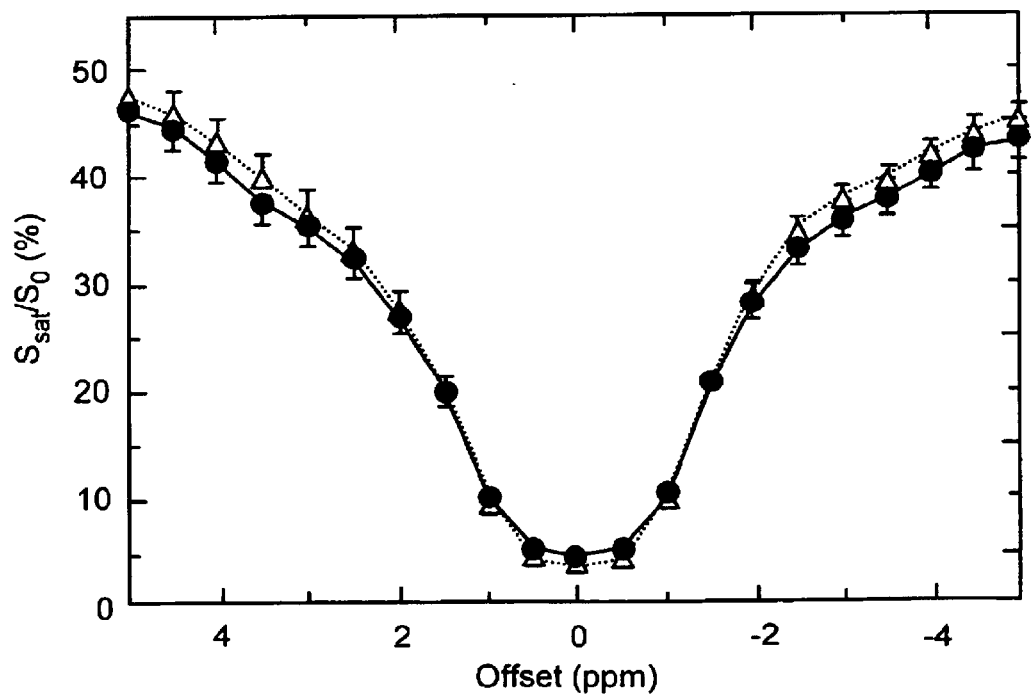
Figure 5C:
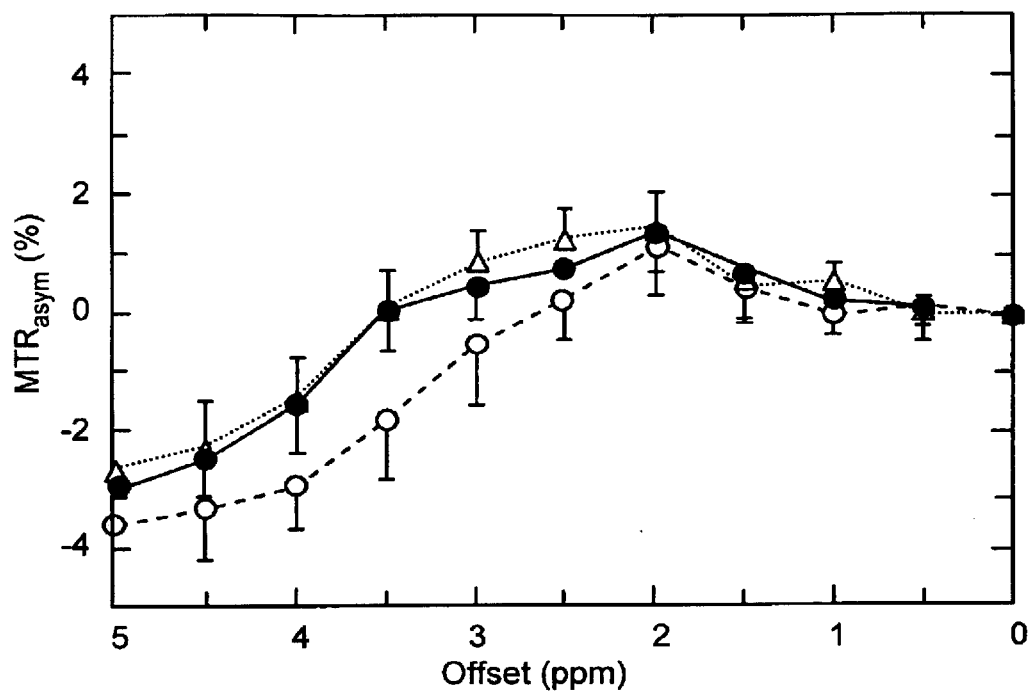
Figure 5D:
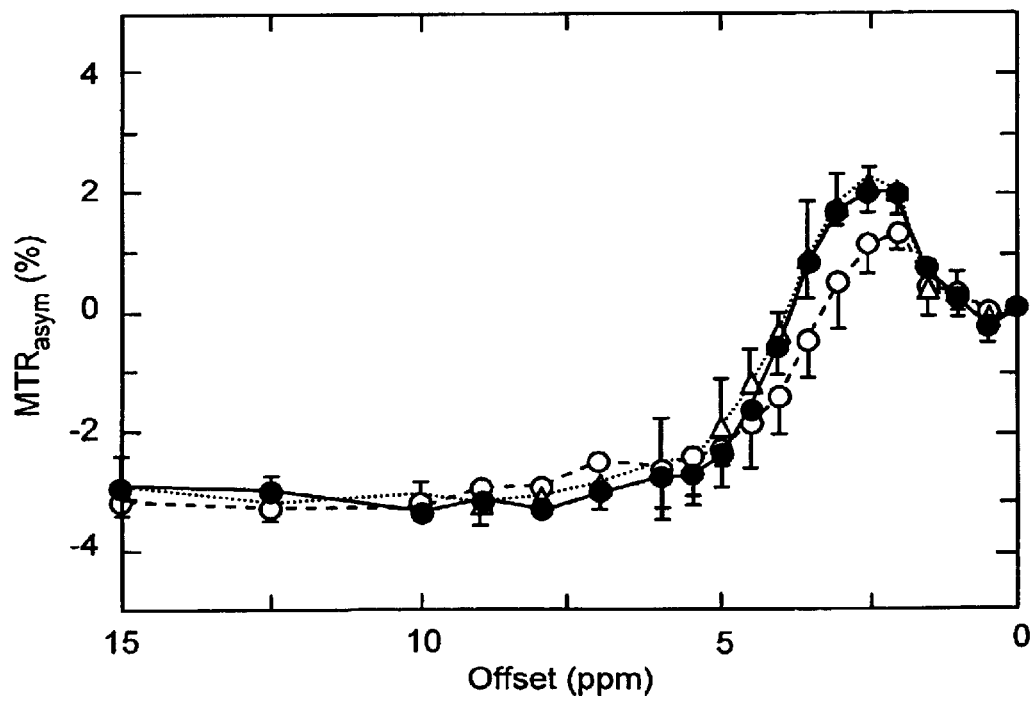
Figure 5E:
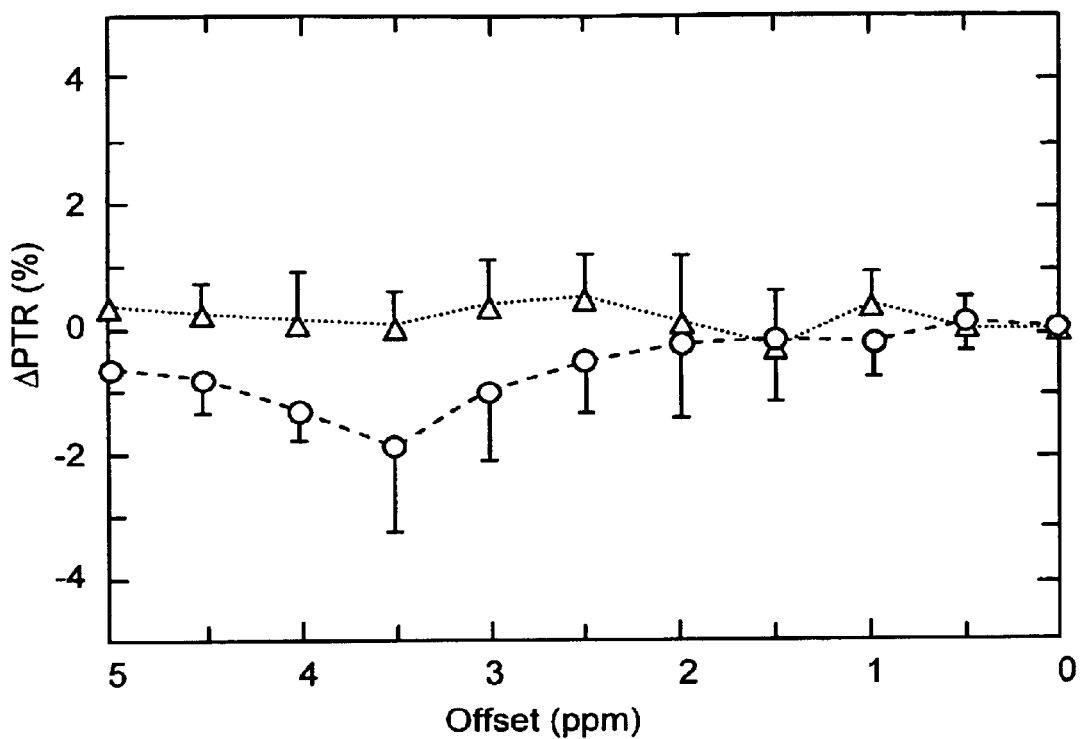
Figure 5F:
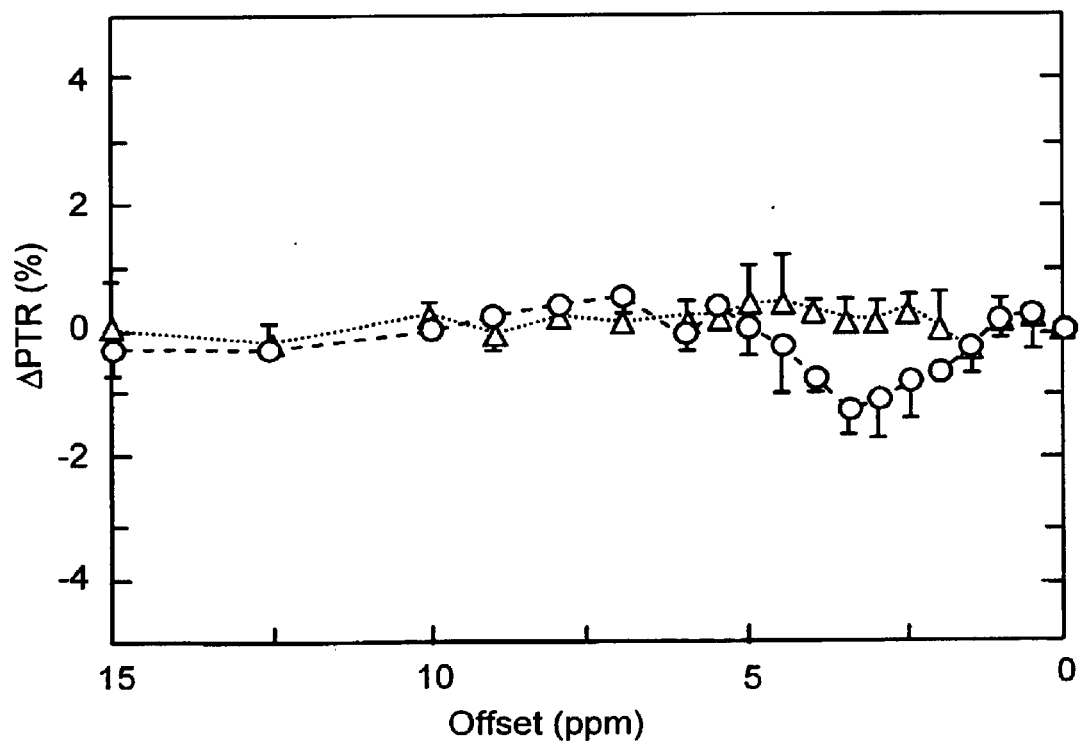

The $MTR_{asym}$ spectra illustrated in FIGS. 5C,D and the $\Delta PTR$ spectra illustrated in FIGS. 5E,F show that postmortem changes are only visible in the 0–5 ppm offset range from water, corresponding to the exchangeable-proton range in the spectra of FIG. 3(~5–10 ppm). Notice that the $MTR_{asym}$ spectra for the contralateral and ipsilateral regions of interest in ischcmic brain (FIG. 5G) compare very well with those for normocapnic and postmortem brain (FIG. 5C), respectively, and that the magnitude of $\Delta PTR$ at the offset of 3.5 ppm (FIG. 5H) is similar for the normocapnia/postmortem case and ischemic/contralateral case.

In FIGS. 5A,B RF saturation effects on water are plotted as a function of saturation frequency offset relative to water (Oppm) for rat brain (n=7). Signal attenuation is due mainly to direct water saturation close to the water frequency and the conventional MT effect over the whole spectral range. However, several interesting features are visible that indicate the existence of APT effects. First, there is a very small dip at a frequency difference of 3.5 ppm from water, corresponding to about 8.3 ppm in the WEX spectra, where the amide protons resonate. Secondly, when comparing in vivo and postmortem (FIG. 5A), the MT curves coincide on the negative-offset side of water, but not on the positive-offset side, where the exchangeable protons resonate. This agrees with the notion that decreased pH in postmortem brain leads to a decreased proton exchange rate, resulting in reduced saturation transfer for the amide protons. During hypercapnia (FIG. 5B), an upward shift of the total MT curve is visible, which is attributed to the BOLD effect, where increased blood flow during hypercapnia lengthens the relaxation time T2, thus narrowing the direct saturation curve of water.

The measured asymmetry curves (FIG. 5C) show an MT difference that is first slightly positive and becomes negative at higher offset. This result supports a recent report that the MT effect is asymmetric with respect to the water resonance, with a center frequency in the aliphatic range. To check whether the asymmetrically becomes constant at some point, an additional series of experiments were performed with extended irradiation range (FIG. 5D, n=3). Indeed, the $MTR_{asym}$ curve becomes constant at about −3% for offsets above 5 ppm, where the exchangeable proton region ends. Using the differences between $MTR_{asym}$ curves for different physiological perturbations, the change in the proton transfer ratio contribution (ΔPTR) to $MTR_{asym}$ can be assessed. When subtracting the normocapilic $MTR_{asym}$ plot from the postmortem curve (FIG. 5E), a maximum change in postmortem signal intensity is found at an offset of 3.5 ppm from water, corresponding exactly to the frequency of the amide protons. The negligible ΔPTR values at offsets above 5 ppm (FIG. 5F) also support the present invention's interpretation of the exchange basis of the measured effects.

Assuming instantaneous amide proton saturation and negligible back exchange from water, the PTR can be derived to be:

$$PTR = \frac{k[\text{amide proton}]}{2[H_2O]R_{1w}}(1 - e^{-R_{1w}t_{sat}}) = \frac{1.32k[\text{amide proton}]}{2[H_2O]}$$

$R_{1w}$ is the average spin-lattice relaxation rate of gray and white matter water (0.714 s$^{-1}$ at 4.7T) and $t_{sat}$ the saturation time (4 s). The values were used in the right part of the equation, which is thus specific for the particular experiment at 4.7 T, while the left part of the equation is mort general. As indicated herein, the postmortem amide signal did not change significantly with respect to normocapnia (FIG. 4), indicating that the mobile protein/peptide content and thus amide proton content remained constant in this early period. Using ΔPTR (−1.90%) and the measured exchanged rates at normocapnia and postmortem (FIG. 4), the total labile amide proton concentration of all proteins and peptides that constitute the broad 8.3 ppm resonance is calculated to be about 85.6 mM, leading to PTR values at the 3.5 ppm offset of 2.94% at normocapnia and 1.04% postmortem.

pH Calibration

To calibrate the exchange rate changes in terms of intracellular pH changes, it is necessary to know the dependence of the exchange rates on pH. As such, a phosphorus spectroscopy as is known to those skilled in the art was performed to determine intracellular pH values, which were 7.11±0.13 at normocapnia, 7.97±0.06 at hypercapnia, and 6.66±0.10 postmortem (n=7). Using the fact that amide proton exchange is predominantly base-catalyzed for pH 6, one has:

$$k=k_{base}[OH]=k_{base} \times 10^{pH-pKw}5.57 \times 10^{pH-6.4}$$

Figure 5G:
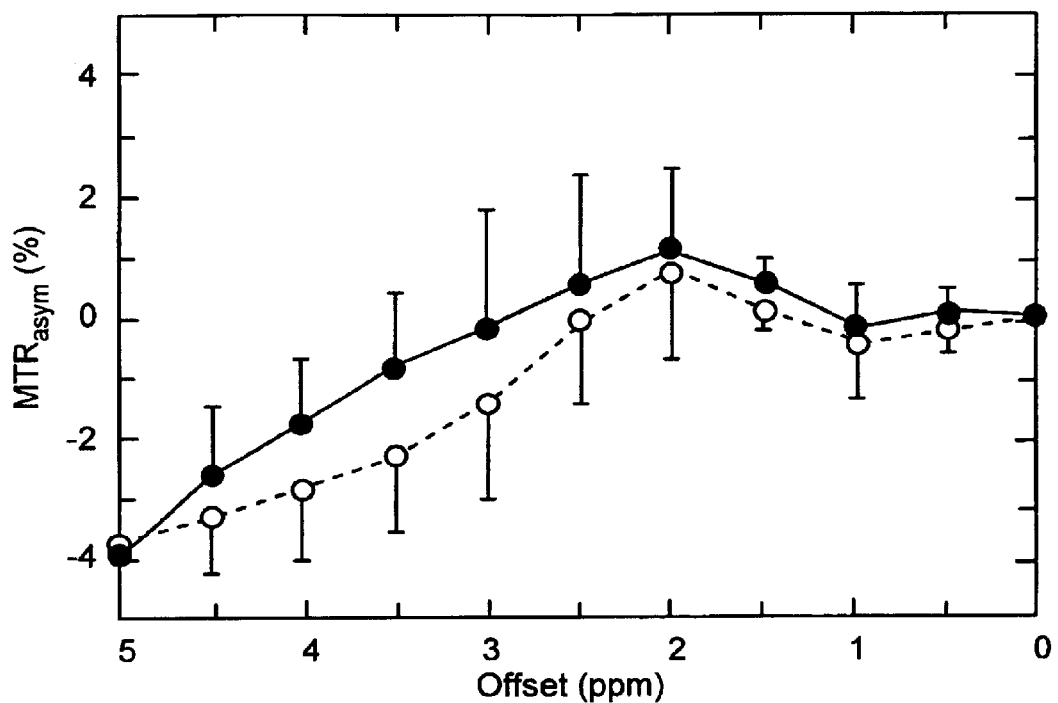
Figure 5H:
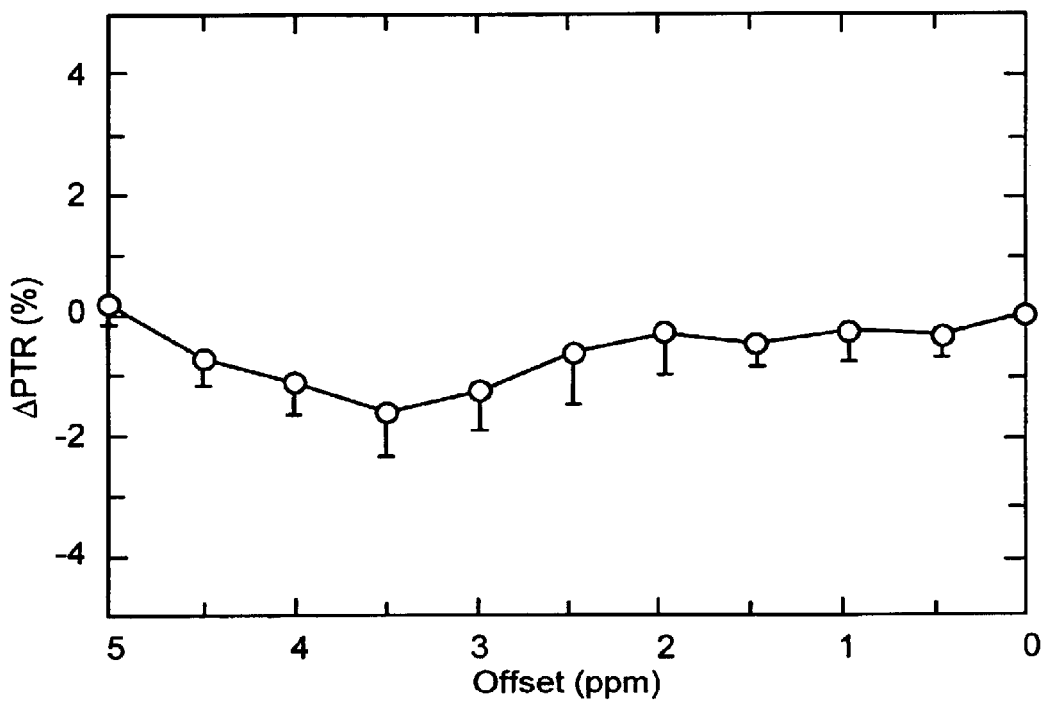
Figure 6A:
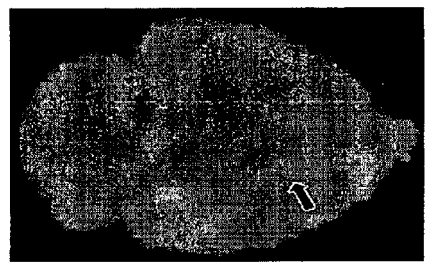
FIGS. 6A–D, are various images of an ischemic rat brain, a T2-weighted image (6A), an amide proton transfer (APT) weighted (pH-weighted) image (6B), an isotropic diffusion-weighted image (6C), and TTC (2,3,5-triphenyltetrazolium chloride) stained image (6D)
Figure 6C:
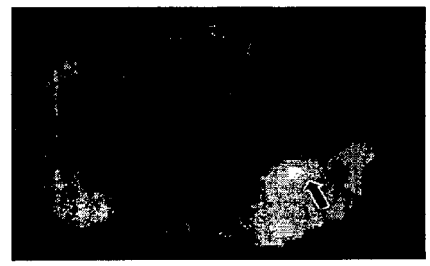
Figure 6B:
Figure 6D:

The base-catalyzed exchange rate ($k_{base}$) and the exponential constant in the last part of the equation were obtained from a two-point fit of the in vivo and postmortem exchange rates versus pH, using the first part of the equation and $pK_w$=15.4 for acid/base equilibrium at 37° C. Using this result, an amide pK value of 17.2 is calculated, in good agreement with literature values. When combining the above two equations, PTR is a direct function of pH, with a dependency on field strength (because of $R_{1w}$) and on species and tissue type (amide proton concentration). For the rat, this leaves a relationship of PTR=5.73×10$^{pH-9.4}$ Ischemia MRI of acute stroke is becoming an increasingly important procedure for rapid assessment of treatment options. Despite many available MRI modalities, it is presently difficult to assess the viability of the ischemic penumbra (a zone of reduced flow around the ischemic core). Impaired oxygen metabolism and concomitant pH changes are crucial in the progress of the ischemic cascade and the possibility for their noninvasive detection will aid the treatment decision. To establish the feasibility of pH-weighted MRI detection of ischemia using amide proton transfer, middle cerebral artery occlusion in seven rats was studied. Similar to the in vivo/postmortem case (FIG. 5C), comparison of the $MTR_{asym}$ spectrum between ischemic and contralateral regions shows a reduction in the intensity for the 2–5 ppm offsets range (FIG. 5G). This is the offset from water. Again the largest ΔPTR effect, −1.57±0.74%, is at 3.5 ppm from water (FIG. 5H). Assuming unchanged pH in the contralateral hemisphere, a pH value of 6.65±0.46 is measured for ischemic brain.

Referring to FIGS. 6A–D, there are shown various images of an ischemic rat brain, a T2-weighted image (6A), a pH-weighted image (6B), an isotropic diffusion-weighted image (6C), and TTC (2,3,5-triphenyltetrazolium chloride) stained image (6D). The pH weighted image (FIG. 6B) based on APT effects was acquired using frequency-labeling offsets of 3.5 ppm (40 scans). $B_o$ inhomogeneity was corrected for using field maps for the same animal, in combination with the MT data acquired at the offsets of ±3.0 and ±4. 0ppm (16 scans). The area of infarction visible on the right side of the images is located in the caudate nucleus, a common region to become infarcted following MCA occlusion. An infarct is not visible on the T2-weighted image, but the pH-weighted image shows the ischemic region, as confirmed by the diffusion weighted image and histology, acquired 8 hours later.

The data shows that it is possible to produce MRI contrast reflecting content and exchange properties of cellular amide protons. Due to the need for both selective irradiation of the amide protons and fast exchange, the method will work better at higher magnetic field. This new contrast opens the possibility to image amide proton content and properties, pH and mobile protein/peptide content and/or changes in these quantities. Some potential applications are imaging of ischemia (FIG. 6A–D), non-invasive cancer imaging (the concentration of labile amide protons/mobile proteins and peptides is often altered in tumors), structural protein studies in vivo, and MR histology-based mobile protein/peptide content and labile amide proton content and property staining.

Animal Preparation

Animal care was according to institutional guidelines. Sprague-Dawley rats (350–500 g, n=22) were anesthetized with halothane (4% induction, 1.5% during surgery). The femoral artery was catheterized to monitor blood pressure and collect blood samples and a tracheotomy was performed. During MRI, inhaled anesthesia was changed to pentobarbital (intraperitoneal cannula, 6 mg/kg/hr). The animal was relaxed with pancuronium bromide (0.2 mg/kg/hr, i.p.). For hypercapnia, inhaled $P_aCO_2$ levels were mechanically adjusted and allowed to stabilize for 15 min. Arterial blood gases and pH were analyzed with a 248 pH/Blood Gas Analyzer (Chiron Diagnostics Ltd., Essex, UK). Body temperature was maintained at 37.5+0.5 'C using a heating pad. Anaesthetized rats were sacrificed using saturated KCl.

MRI and $^1$H MRS

Experiments were performed on a horizontal bore 4.7T GE-CSI scanner using a 3-cm surface coil. For WEX spectroscopy, water was selectively labeled by the pulse unit (90 {spatially-selective}-$G_1$-180° {water-selective}-$G_1$-90° {spatially-selective}), after which label transfer was detected as a function of mixing time (-tm-90° {spatially-selective}-detection Spatial selection was improved with outer-volume suppression. In MT experiments including both conventional MT and APT effects), train of 400 Gaussian pulses (length 6.6 ms, 180° flip angle, delay 3.4 ms, total duration 4 s, average RF power 50 Hz) was used, followed by four-shot spin-echo echo-planar image acquisition (TR 10 s, TE 50 ms, 64×64, FOV 40×40 mm$^2$). The axial slice was located 4 mm from the brain top (thickness 2 mm, for in vivo/postmortem) or at the caudate nucleus (thickness 4 mm, for ischemia).

One image was acquired per offset, starting from the water (O Hz, on-respmamce) and subsequently altered between positive and negative offsets. An unsaturated image was acquired for all physiological states. Signal intensities as a function of offset (called MT spectrum or z-spectrum) were fitted using a 12th-order polynomial. The actual water resonance was assumed to be at the frequency with the lowest signal intensity of the interpolated fitted curve. After fitting, the measured curve minima (resolution 1Hz) were shifted to all coincide between voxels. Five regions of interest covering the whole brain (fronto-parietal cortex, inferior colliculus, cerebellum) were chosen and averaged.

$^{31}$P Spectroscopy

A double-tuned ($^{31}$P/$^1$H) coil was used. Localized brain spectra were acquired using 3D outer volume suppression followed by hard pulse excitation. Insignificant skull muscle signal contamination was confirmed by disappearance of phosphocreatine (PCr) signal about 15 min postmortem. Ischemic muscle can display PCr for hours. Intracellular pH ($pH_i$) was calculated from the chemical shift difference ($\delta$) between inorganic phosphate and PCr using $pH_i$=6.75 +log [($\delta$–3.26)/(5.70 –67)].

EXAMPLE 2

Figure 7:
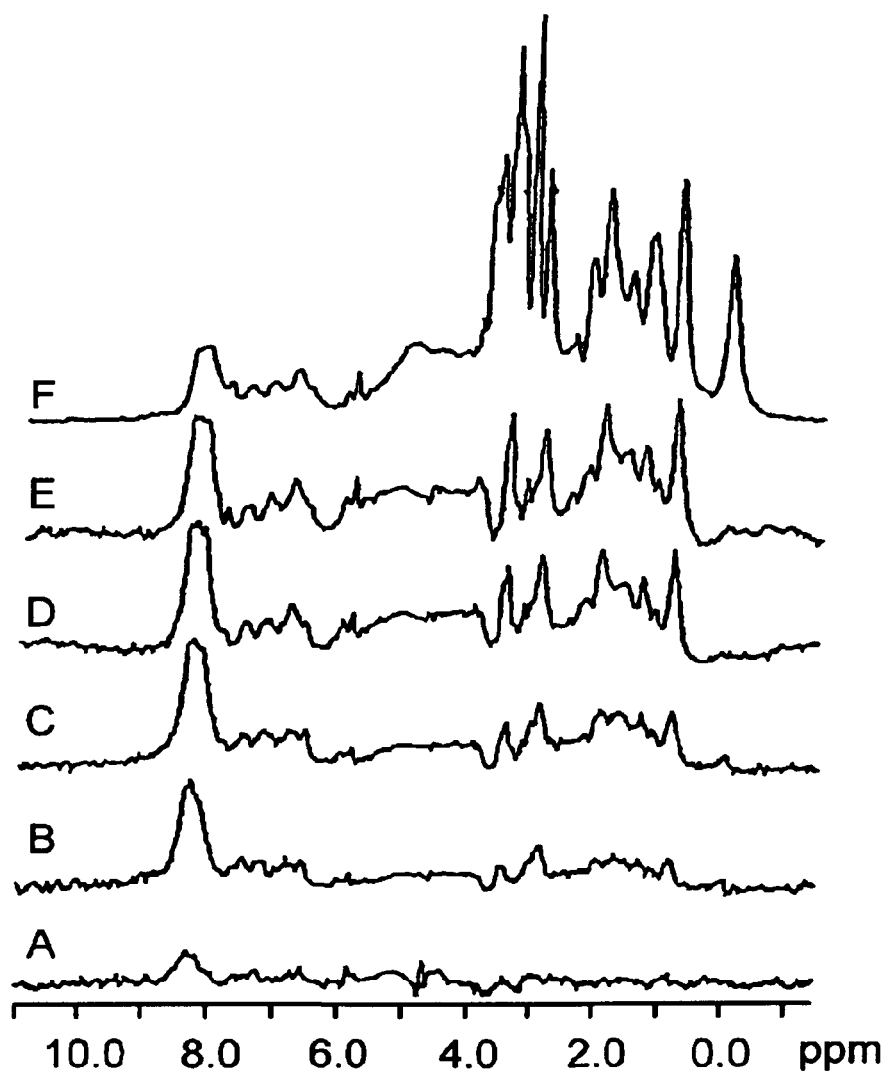
FIG. 7 shows water exchange spectra (WEX spectra) for perfused RIF-1 cancer cells.

Referring to FIG. 7 there is shown a water exchange spectra (WEX spectra) for perfused RIF-1 cancer cells as a function of magnetization transfer time Tm. The illustrated WEX spectra (256 scans, 9.4T, sweep width 5000Hz, TE =8 ms, TR =2s) includes 5 curves (curves A–E) illustrating the WEX spectra for different magnetization transfer times. For purposes of comparisbn, FIG. 7 also includes a normal water suppressed spectrum (64 scans); curve F. Calculations based on signal to noise ratio (including a correction for the number of scans) show that the intensity of the amide resonance around 8.3 ppm at Tm =502.3 is about 75% of that in the reference spectrum. The chemical shifts and intensities for certain of the peaks between about 0.5 ppm to about 3.5 ppm, have striking resemblance with mixed protein spectra assigned to brain literature. The large resonance at 8.3 ppm is attributed to the protein peptide amide proton groups.

Figure 8:
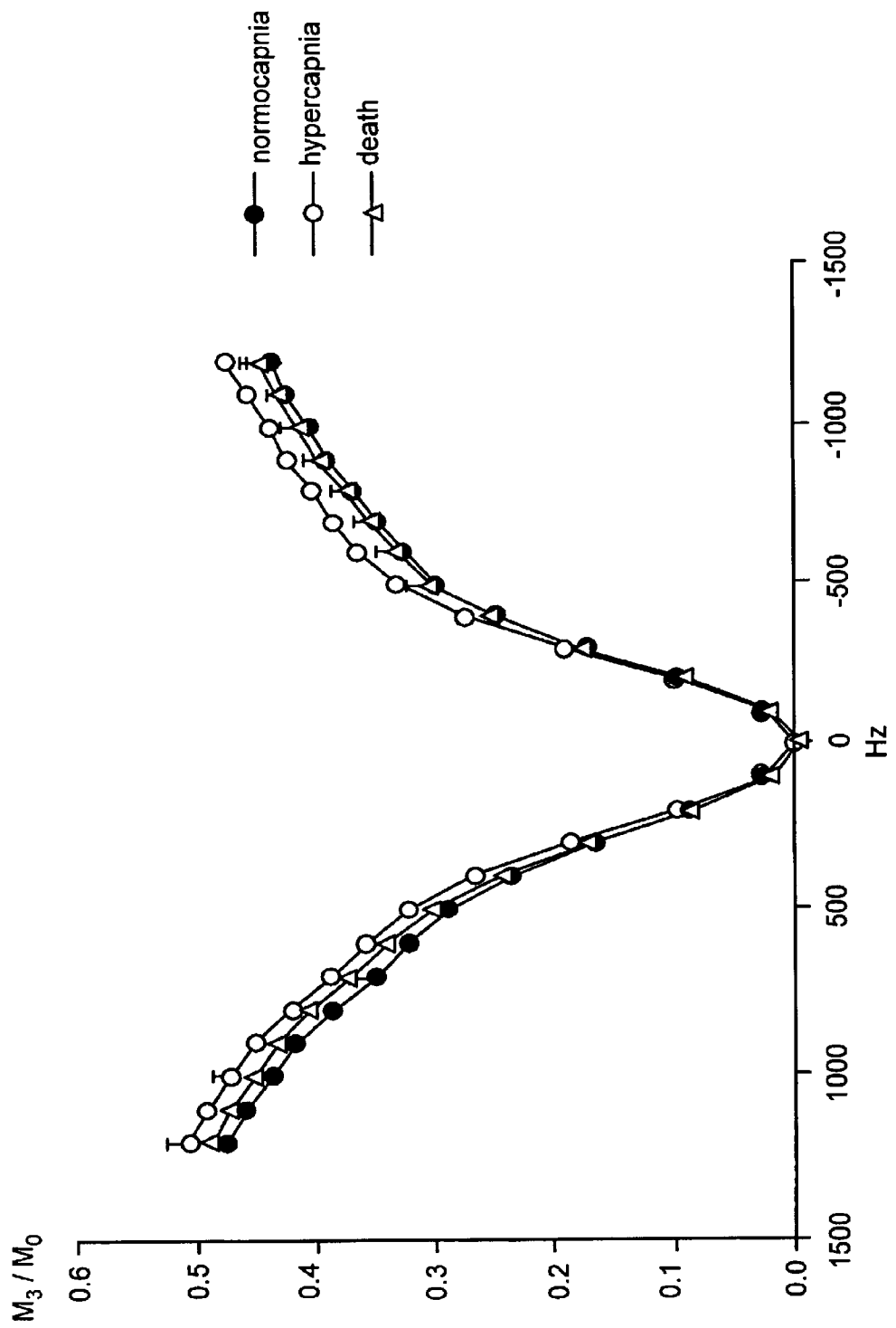
FIG. 8 is a graph of the Z-spectrum for brain water of a rat brain.

Referring now to FIG. 8 there is shown a graph of the Z-spectrum for brain water of a rat brain and the results for 7 rats are displayed therein. In these z-spectra, the water signal intensity is plotted as a function of the RF saturation frequency offset with respect to water. These spectra do not include the effect of T2 and spin density, as they are signal ratios. There may be an effect of TI and T2, however, on the direct irradiation curve for water (around zero, which affects the signal intensity). In addition, the well known in vivo Magnetization Transfer contrast (MTC) effect will occur, which may be as large as 5–50%. To avoid the influence of this direct saturation effect and the MTC, it is necessary to perform an asymmetry analysis (right side of water minus the left side of water).

Figure 9:
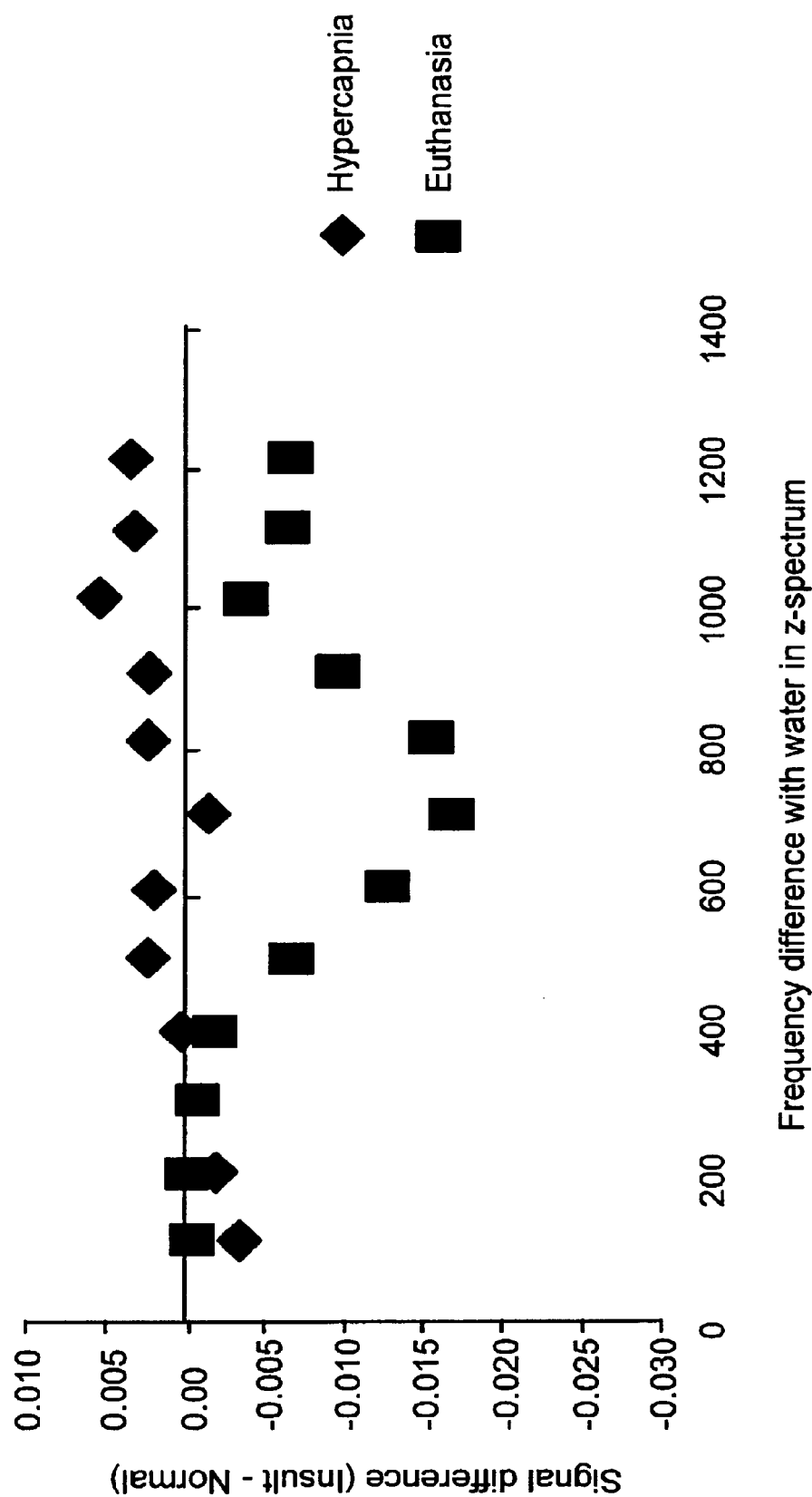
FIG. 9 is a graph illustrating fractional water signal intensity difference due to physiological alteration between the asymmetry spectra as a function of irradiation frequency.

Referring now to FIG. 9, a graph illustrating fractional water signal intensity difference due to physiological alteration (hypercapnia or euthanasia) between the asymmetry spectra (right-left intensity in the z-spectra shown in FIG. 8) displayed as a function of irradiation frequency. The results shown are the average over 7 rats.

The illustrated results show significant changes for these physiological perturbations at the expected amide proton frequency of 8.3 ppm (3.5 ppm =700 Hz at 4.7 Telsa from water, located at 0 Hz) and a clear minimum at 3.5 ppm was found for both insults. The postmortem data were significant in each of the individual rats, while the resulting difference data for hypercapnia were only significant for the group of animals. This is believed to be attributable to the typical shape of the pH curve, which flattens for these amide protons around pH 7.

Figure 10:
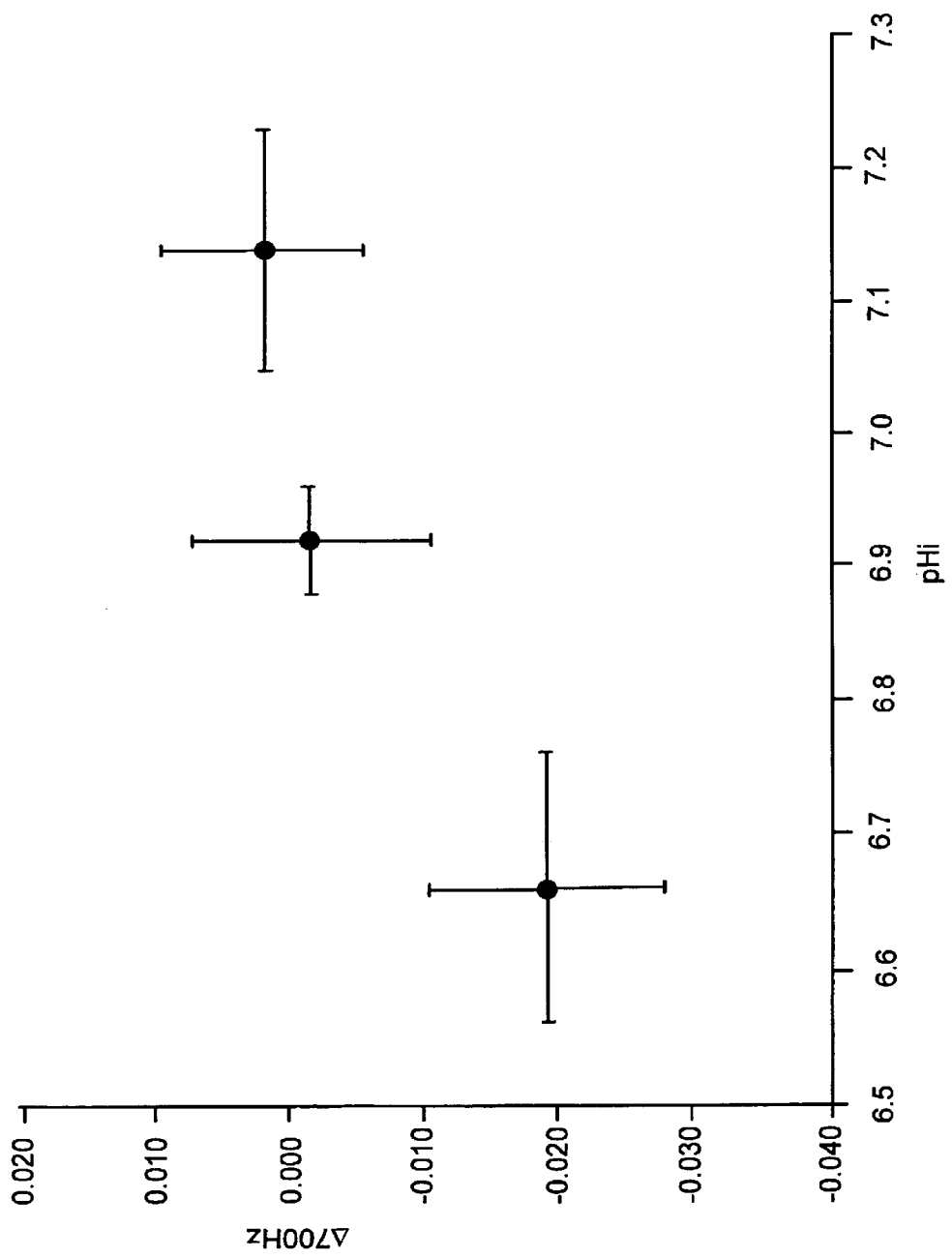
FIG. 10 is a graph of MRI signal differences in the z-spectrum at 3.5 ppm (700Hz at 4.7 Telsa) from water as a function of intracellular pH.

Referring now to FIG. 10 there is shown a graph of MRI/NMR signal differences at 3.5 ppm from water as a function of intracellular pH. The signal difference was measured performing an asymmetry analysis of the z-spectrum around the water frequency (O Hz). The intracellular pH was measured using a phosphorus ($^{31}$P) spectroscopy as is known to those skilled in the art.

EXAMPLE 3

Figure 11C:
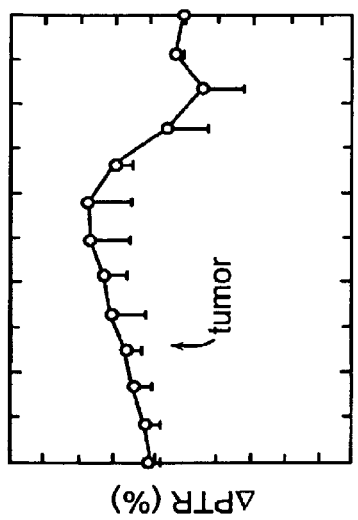
FIGS. 11A–C are various graphs illustrating MT spectra, $MTR_{asym}$ spectra, and $\Delta PTR$ spectra for a 9L rat brain tumor and collateral region.
Figure 11B:
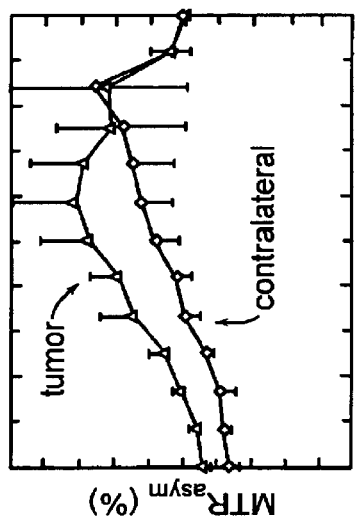
Figure 11A:
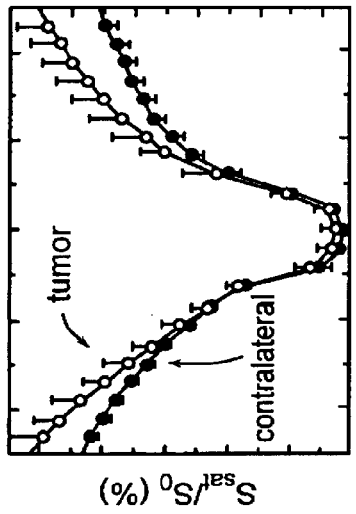

This example illustrates a specific modality in the clinical MRI examination of cancers. Referring now to FIGS. 11 A–C there are shown various graphs illustrating MT spectra, $MTR_{asym}$ spectra, and $\Delta PTR$ spectra for a 9L rat brain tumor and collateral region. Similar to the in vivo/postmortem system and ischemic/contralateral system, the tumor/contralateral imaging signal intensities are substantially reduced due to the effects of direct water saturation and conventional MT. However, it is surprising that the $MTR_{asym}$ curves in the tumor/contralateral case show something quite different, namely an increase in the tumor $MTR_{asym}$ spectra over a range of offsets between 2–5 ppm. Another different point based on these two tumor-implanted animals (6 measurements) is that there is a positive magnitude of $\Delta PTR$ at this offset range, and the maximum change in the tumor $MTR_{asym}$ spectra was found to be at an offset of 2.5–3 ppm. This is attributed to high $pH_i$, high labile amide proton content and/or mobile protein/peptide content, and low spatial field inhomogeneity in the tumor.

Figure 12:
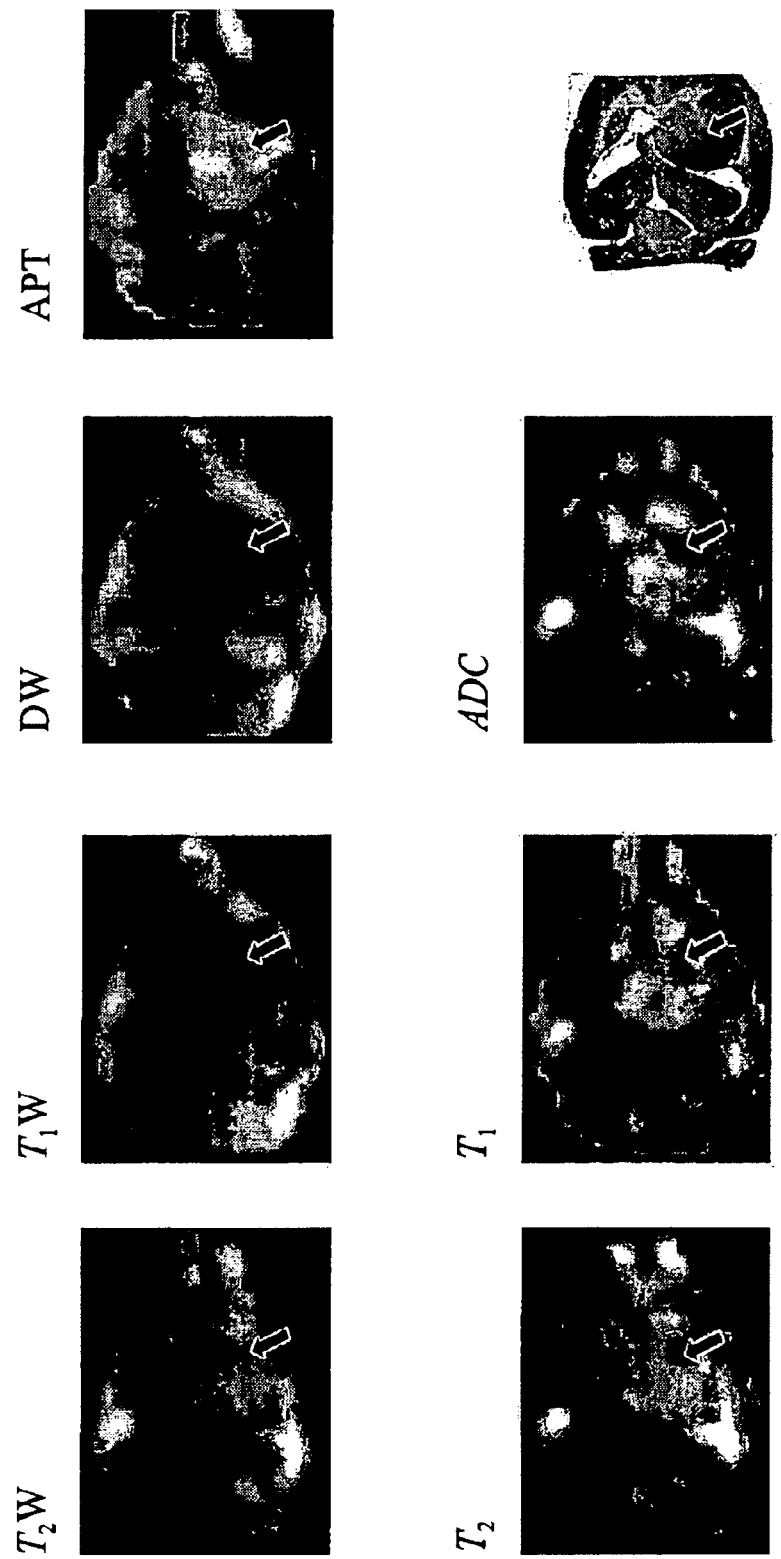
FIG. 12 includes various images of a rat brain with the 9L glioma/tumor.

FIG. 12 includes various images of a rat brain with the 9L glioma/tumor, more particularly this figure shows the acquired $MTR_{asym}$ image, namely the APT image, together with several common MR images. The APT image was acquired using frequency-labeling offsets of ±3.5 ppm (16 scans), and $B_0$ inhomogeneity was corrected using field maps from the same animal, in combination with the MT data acquired at the offsets of ±3.0 and ±4.0 ppm (4 scans). Based on these images, several important conclusions are reached for this type of tumor: (i) increased T1, namely T1 hypointensity; (ii) increased T2, namely T2 hyperintensity; (iii) increased apparent diffusion coefficient (ADC), namely DWI hypointensity; and (vi) increased $MTR_{asym}$. It is important to note that the $MTR_{asym}$ images or APT images show a clear boundary of the tumor, which well agrees with histology. Roughly speaking, this increased $MTR_{asym}$ in tumor means that there is increased labile amide proton content or exchange rate and/or mobile protein/peptide content and/or pH$_i$ in the tumor.

EXAMPLE 4

A demonstration to illustrate selectively detecting transfer of saturated exchangeable amide protons from mobile intracellular proteins/peptides to water and in particular for separating this amide proton transfer (APT) effect from BOLD and conventional magnetization transfer (MT) effects. To demonstrate the principle, APT spectra in the rat brain (n=15) were measured in vivo and postmortem. Exchange rates of the amide protons were measured using proton exchange spectroscopy and pH was quantified using phosphorus spectroscopy. The APT effect during this physiological change was on the order of 1–2%. This proton transfer procedure should be useful to image pH effects and protein and/or peptide content in vivo.

Sprague-Dawley rats (350–500 g) were anesthetized using, pentobarbital (i.v.) and mechanically ventilated. Experiments were performed on a horizontal bore 4.7 TGE CSI animal imager (40 cm bore). A proton surface coil (inner diameter 3 cm) was used for RF transmission and reception. For the phosphorus experiments a double-tuned ($^{31}$P/$^1$H) coil was used. In the MT experiments a train of 400 Gaussian pulses (duration 6.6 msec, delay, 3.4 msec, total duration 4 sec) was used for off-resonance irradiation. Each single pulse within the Gaussian pulse train has a flip angle of 180°, corresponding to an average RF power of about 50 Hz. Two or four-shot spin-echo EPI with TE =50 ms was used for data acquisition. The imaging matrix was 64×64, FOV was 40×40 mm$^2$ and the imaging slice thickness was 2 mm. The raw data set was corrected for spatial magnetic field inhomogeneity on a pixel by pixel basis. Five ROIs covering the whole brain were chosen for quantitative analysis. WEX (water-exchange-filter) spectroscopy was used to measure change rates of the amide protons. All MRI and MRS experiments were performed both in vivo and after cardiac arrest.

Figure 13A:
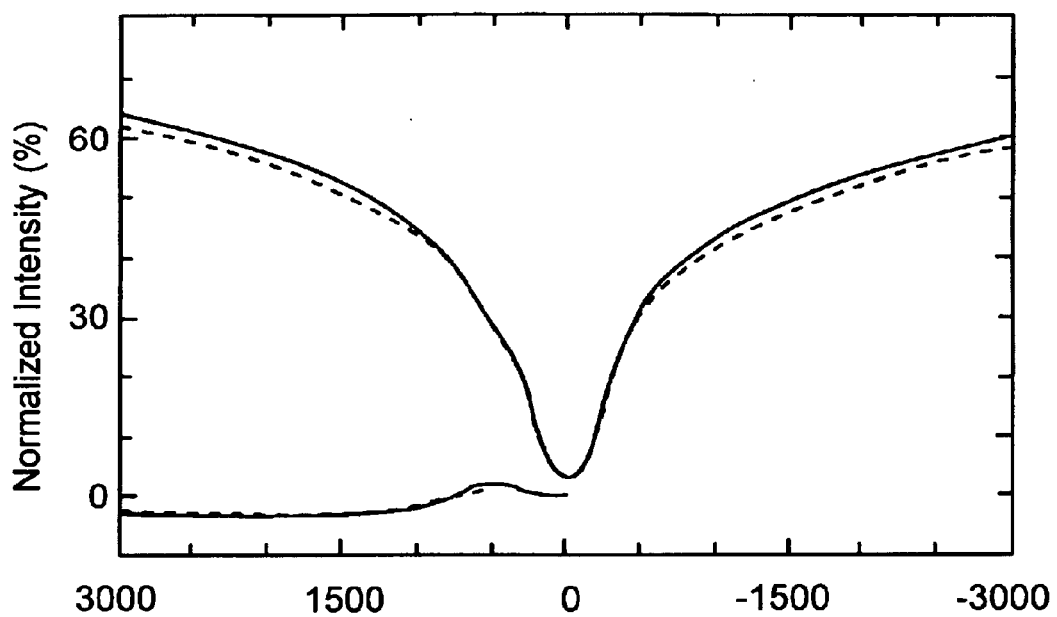
FIGS. 13A,B are graphs illustrating that the amide proton transfer effect is not the same as conventional MT effects but limited to a narrow ppm range in the proton spectrum.
Figure 13B:
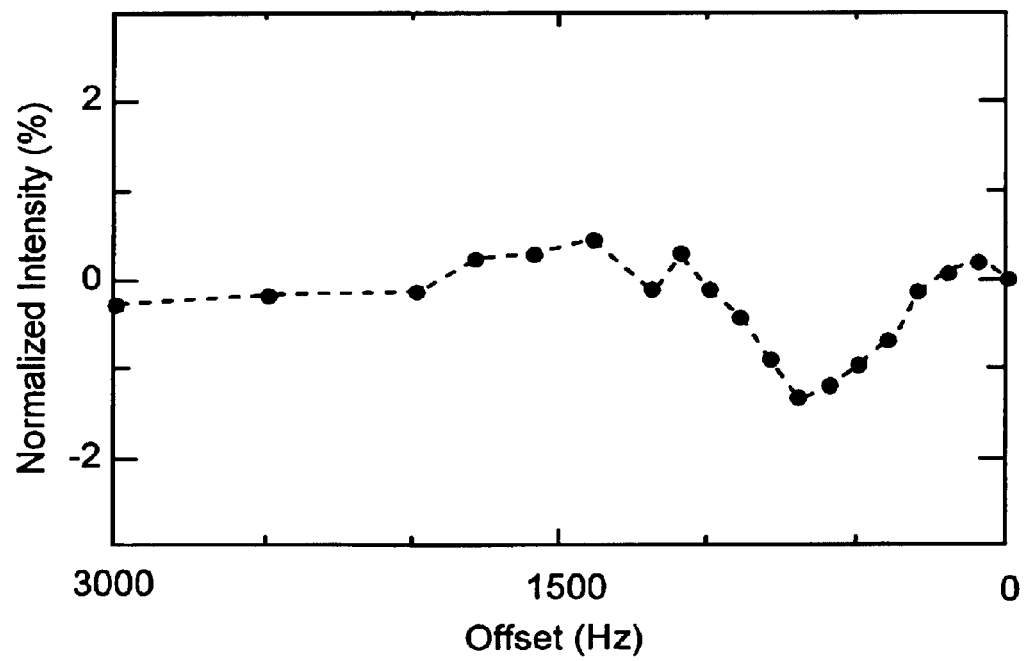

Standard MT-ratio (normalized with respect to unsaturated) spectra in vivo (solid) and postmortem (dashed) are shown in FIG. 13A. The difference in these curves is due to the BOLD effect, changes in the shape of the direct saturation curve and potential MT changes. To selectively assess only the APT effect, an asymmetry analysis was performed by subtracting MT ratios obtained at the negative offset minus those at the corresponding positive offset. FIG. 13B shows a close-up of the results of subtracting the in vivo difference from the post-mortem difference.

The maximum change in the difference signal intensities is found at 3.5 ppm (700 Hz at 4.7 Telsa) from water. Using 4.75 ppm for water, this corresponds closely to the broad amide proton frequency (8.25 ppm). Using WEX spectroscopy, the exchange rates of the amide protons in the proton spectra were found. The total protein signal as determined from integration of the amide peak after complete inversion transfer in the WEX spectra did not change significantly.

The intracellular pH values determined using $^{31}$P spectra were 7.15±0.09 and 6.65±0.10 in vivo and postmortem, respectively. This is in good agreement with literature data on rat brain ischemia showing an in vivo pHi of 7.05 under normal conditions and pHi =6.44 during prolonged isohemia, where continued lactate formation may cause lower pH than in postmortem tissue. Decreased pH in the brain accompanied the decreased exchange rates for the amide protons, resulting in a decreased off-resonance saturation transfer from the exchangeable protons. As a result, the imaging signal intensities (water MR signals) increased at the side of the positive offsets, and the asymmetry difference spectrum decreased for the postmortem brain. Although a preferred embodiment of the invention has been described using specific terms, such description is for illustrative purposes only, and it is to be understood that changes and variations may be made without departing from the spirit or scope of the following claims.

What is claimed is:

1. The method for claim determining an effect of amide proton transfer between amide protons of endogenous mobile proteins/peptides and water protons as measured by one or MRI or NMR spectroscopy or spectroscopic imaging, said effect being reflected in one of amide proton content, amide proton exchange properties or mobile protein/peptide content, said method comprising the steps of:

irradiating a pool of amide protons of said mobile protons and peptides that is in exchange with a pool of water protons to label the amide protons of said pool of amide protons and measuring the effect on the water protons;

determining an amide proton transfer (APT) effect corresponding to the transfer of saturation between said pool of amide protons and said pool of water protons; and determining change in or difference between one of labile amide proton content, pH or pH effects from the determined amide proton transfer effect between spatial areas, tissues and the like being subjected to said irradiation.

2. The method of claim 1, wherein said effect is used to assess one of cellular water concentration or changes to cellular water concentration.

3. A method for determining an effect of amide proton transfer between amide protons of endogenous mobile proteins/peptides and water protons as measured by one of MRI or NMR spectroscopy or spectroscopic imaging, said effect being reflected in one of amide proton content, amide proton exchange properties or mobile protein/peptide content, said method comprising the steps of:

irradiating a pool of amide protons of said mobile protons and peptides that is in exchange with a pool of water protons to label the amide protons if said pool if amide protons and measuring the effect on the water protons;

determining an amide proton transfer (APT) effect corresponding to the transfer of saturation between said pool of amide protons and said pool of water protons;

establishing a relationship between proton transfer effect of amide protons and said one of amide proton content, cellular pH or pH effects; and determining a magnitude of one of labile amide proton content, mobile protein/peptide content, pH or pH effects from the determined amide proton transfer effect and the established relationship.

4. The method of claim 1 or claim 3, wherein said determining an amide proton transfer effect includes determining one of an amide proton transfer ratio, and amide proton transfer rate or an amide proton transfer related change in water signal intensity.

5. The method of claim 4, wherein said irradiating includes irradiating the amide protons with electromagnetic radiation of about a 8.3 ppm resonance in a proton spectrum of the endogenous amide protons.

6. The method of claim 4, wherein determining an amide proton transfer effect includes magnetic resonance imaging of the pool of water protons at a predetermined period of time after transfer of saturation.

7. The method of claim 4, wherein the tissues or spatial areas being subjected to said irradiating include healthy tissue, cancerous tissues whether malignant or benign, tissue that has experienced trauma, infarct, insult, bodily fluids and the like.

8. The method of claim 1 or claim 3, wherein said irradiating includes irradiating the amide protons one of at about or at a resonance in a proton spectrum of the endogenous amide protons.

9. The method of claim 1 or claim 3, wherein said irradiating includes irradiating amide protons with electromagnetic radiation at a 8.3 ppm resonance in a proton spectrum of the endogenous amide protons.

10. The method of claim 1 or claim 3, wherein determining an amide proton transfer effect includes magnetic resonance imaging of the pool of water protons at a predetermined period of time after transfer of saturation.

11. The method of claim 1 or claim 3, wherein the tissues or spatial areas being subject to said irradiating include healthy tissue, cancerous tissues whether malignant or benign, tissue that has experienced trauma, infarct, insult, bodily fluids and the like.

12. A method for magnetic resonance imaging comprising the steps of:
acquiring MR image data of a spatial region of interest;
assessing a magnitude of or a change in one of labile amide proton content, mobile protein/peptide content or pH of endogenous or exogenous tissue the region of interest using a $^1$H saturation transfer technique; and
adjusting contrast of the acquired MR image data based on said assessing so the adjusted acquired MR image data reflects relative differences of said one of labile amide proton content, protein/peptide content, or pH between spatial areas, tissues, and the like within the spatial region of interest.

13. The imaging method of claim 12, further comprising the step of:
generating images based on the adjusted acquired MR image data.

14. The imaging method of claim 12, wherein said assessing further includes:
irradiating a pool of amide protons in the region of interest that is in exchange with a pool of water protons in the region of interest with sufficient electromagnetic radiation to magnetically label the amide protons of said pool of amide protons; and
determining a given amide proton transfer effect corresponding to the transfer of saturation between said pool of amide protons and said pool of water protons; and
assessing said one of labile amide proton content, protein/peptide content or pH, based on the determined given amide proton transfer effect.

15. The imaging method of claim 12, or claim 14, wherein the tissues or spatial areas within the spatial region include healthy tissue, cancerous tissues whether malignant or benign, tissue that has experienced trauma, infarct, insult, bodily fluids and the like.

16. The method of claim 12, wherein:
said assessing includes assessing labile amide proton content of mobile endogenous proteins/peptides based on the determined labile amide proton transfer effect; and
said adjusting includes adjusting the contrast of the acquired MR image data based on said assessing labile amide proton content so the adjusted acquired MR image data reflects the relative differences in amide proton content.

17. The method of claim 12, wherein:
said assessing includes assessing mobile protein/peptide content based on the determined labile amide proton transfer effect; and
said adjusting includes adjusting the contrast of the acquired MR image data based on said assessing mobile protein/peptide content so the adjusted acquired MR image data reflects the relative differences in protein/peptide content.

18. The method of claim 12, wherein:
said assessing includes assessing pH based on the determined given amide proton transfer effect of mobile endogenous proteins/peptides; and
said adjusting includes adjusting the contrast of the acquired MR image data based on said assessing pH so the adjusted acquired MR image data reflects the relative differences in pH.

19. A method of MRI comprising the steps of:
acquiring MR image data that includes:
placing one of a sample or subject of interest in a MRI scanner,
selectively exciting MR signal in at least one spatial region of said sample or subject, and
detecting signals from said spatial region to generate image data;
assessing one of labile amide proton content of mobile endogenous proteins/peptides, mobile protein/peptide content or pH of said at least one spatial region of said sample or subject using a $^1$H saturation transfer technique; and
adjusting the generated MRI image data based on said assessing so the adjusted generated MR image data reflects relative differences of said one of labile amide proton content, mobile protein/peptide content or pH between spatial areas, tissues, and the like within said at least one spatial region.

20. The MRI method of claim 19, wherein said assessing includes:
irradiating a pool of amide protons of mobile endogenous proteins/peptides in said at least one spatial region of said sample or subject that is in exchange with a pool of water protons in said at least one spatial region of said sample or subject with sufficient electromagnetic radiation to magnetically label the amide protons of said pool of amide protons; and
assessing said one of labile amide proton content of mobile endogenous proteins/peptides, mobile protein/peptide content, or pH, based on transfer of saturation between said pool of amide protons and said pool of water protons.

21. The method of claim 19 or claim 20, wherein the tissues or spatial areas within the at least one spatial region include healthy tissue, cancerous tissues whether malignant or benign, tissue that has experienced trauma, infarct, insult, bodily fluids and the like.

22. The MRI method of claim 19, wherein said assessing further includes:
irradiating an endogenous pool of amide protons of mobile endogenous protons/peptides in said at least one spatial region of said sample or subject that is in exchange with a pool of water protons in said at least one spatial region of said sample or subject with sufficient electromagnetic radiation to magnetically label the amide protons of said pool of amide protons; and determining an amide proton transfer effect corresponding to the transfer of saturation between said pool of amide protons and said pool of water protons; and assessing one of labile amide proton content of mobile endogenous protons/peptides, mobile endogenous protein/peptide content or pH of tissue based on the determined amide proton transfer effect.

23. The MRI method of claim 19, wherein said adjusting includes adjusting the contrast of the generated MRI image data based on said assessing of one of labile amide proton content of mobile endogenous proteins/peptides, mobile endogenous protein/peptide content or pH, so the adjusted MRI image data reflects the relative differences in said one of labile amide proton content, mobile endogenous protein/peptide content or pH for tissue areas making up said at least one spatial region.

24. The MRI method of claim 19, wherein said adjusting includes adjusting the contrast of the generated MRI image data based on said assessing of said labile amide proton content so the adjusted MRI image data reflects the relative differences in amide proton content between the tissues making up said at least one spatial region.

25. The MRI method of claim 19, wherein said adjusting includes adjusting the contrast of the generated MRI image data based on said assessing of said mobile endogenous protein/peptide content so the adjusted MRI image data reflects the relative differences in said mobile endogenous protein/peptide content between the tissues making up said at least one spatial region.

26. The MRI method of claim 19, wherein said adjusting includes adjusting the contrast of the generated MRI image data based on said assessing of pH so the adjusted NMR image data reflects the relative differences in pH between the tissues of said at least one spatial region.

27. The MRI method of claim 19, wherein said assessing includes selectively exciting MR signal in a spatial tissue region including in whole or in part, one of a brain, a body, a body extremity, a lesion or a tumor.

28. A method for relating amide proton exchange properties to tissue pH, comprising the steps of:

irradiating a pool of amide protons of mobile endogenous proteins/peptides that is in exchange with a pool of water protons to label the amide protons of said pool of amide protons and measuring the effect on the water protons the amide protons are in exchange with;

determining an amide proton transfer effect corresponding to the transfer of saturation between said pool of amide protons and said pool of protons; and determining tissue pH or pH effects of spatial areas, tissues and the like being subjected to said irradiation from the determined amide proton transfer effect.

29. The method of claim 28, further comprising the step of extracting tissue(s) from a body and wherein said steps of irradiating, determining an amide proton transfer effect and determining pH are performed using the extracted tissue(s).

30. The method of claim 28, wherein determining an amide proton transfer effect includes magnetic resonance imaging of the pool of water protons at a predetermined period of time after transfer of saturation.

31. The method of claim 28, further comprising the step of establishing a relationship between proton transfer effect of amide protons and tissue pH.

32. The method of claim 28, wherein said establishing a relationship includes establishing an empirical relationship between the proton transfer effect of amide protons and tissue pH.

33. A method for relating a water proton signal intensity to protein and peptide content, comprising the steps of:

irradiating an endogenous pool of amide protons of mobile endogenous proteins/peptides that is in exchange with a pool of water protons to label the amide protons of said pool of amide protons and measuring the effect on the water protons the amide protons are in exchange with;

determining a or change in an amide proton transfer effect corresponding to the transfer of saturation between said pool of amide protons and said pool of water protons for spatial areas, tissues and the like being subjected to irradiating; and determining the protein and peptide content from the determined amide proton transfer effect on the water signal intensity.

34. A method for relating a water proton signal intensity to protein and peptide content, comprising the steps of:

irradiating an endogenous pool of amide protons of mobile endogenous proteins/peptides that is in exchange with a pool of water protons to label the amide protons of said pool of amide protons and measuring the effect on the water protons the amide protons are in exchange with;

determining a magnitude of an amide proton transfer effect corresponding to the transfer of saturation between said pool of amide protons and said pool of water protons for spatial areas, tissues and the like being subjected to said irradiating; and determining the protein and peptide content from the determined amide proton transfer effect on the water signal intensity.

35. The method of claim 33 or claim 34, wherein determining an amide proton transfer effect includes magnetic resonance imaging of the another pool of water protons a predetermined period of time after transfer of saturation.

36. The method of claim 33 or claim 34, further comprising the step of establishing a relationship between proton transfer effect of amide protons and protein and peptide content.

37. The method of claim 36, wherein said establishing a relationship includes establishing an empirical relationship between the proton transfer effect of amide protons and protein and peptide content.

38. A method for imaging labile amide proton content and properties via exchange relationship of amide protons with the water signal, said method comprising the steps of:

irradiating an endogenous pool of amide protons of mobile endogenous proteins/peptides that is in exchange with a pool of water protons to label the amide protons of said pool of amide protons and measuring the effect on the water protons the amide protons are in exchange with;

determining an amide proton transfer effect corresponding to the transfer of saturation between said pool of amide protons and said pool of water protons; and determining a change in one of labile amide proton content, mobile protein/peptide content, cellular pH or pH effects from the determined amide proton transfer effect for spatial areas, tissues and the like being subjected to said irradiating.

39. A method for imaging labile amide proton content and properties via exchange relationship of amide protons with the water signal, said method comprising the steps of:

irradiating an endogenous pool of amide protons of mobile endogenous proteins/peptides that is in exchange with a pool of water protons to label the amide protons of said pool of amide protons and measuring the effect on the water protons the amide protons are in exchange with;

determining an amide proton transfer effect corresponding to the transfer of saturation between said pool of amide protons and said pool of water protons; and determining a magnitude of one of labile amide proton content, mobile protein/peptide content, cellular pH or pH effects from the determined amide proton transfer effect for spatial areas, tissues and the like being subjected to said irradiating.

40. The method of claim 38 or claim 39, wherein said irradiating includes irradiating the amide protons one of at or at about a resonance in a proton spectrum of the amide protons.

41. The method of claim 38 or claim 39, wherein determining an amide proton transfer effect includes magnetic resonance imaging of the another pool of water protons a predetermined period of time after transfer of saturation.

42. The method of claim 38 or claim 39, wherein said determining the magnitude of or said determining the change in includes establishing a relationship between proton transfer effect and said magnitude of or change in said one of labile amide proton content of mobile endogenous proteins/peptides, mobile protein/peptide content, tissue pH or pH effects.

43. The method of claim 42, wherein said establishing a relationship includes establishing an empirical relationship between the proton transfer effect and said magnitude of or a change in one of labile amide proton content of endogenous mobile proteins/peptides, mobile protein/peptide content, tissue pH or pH effects.

* * * * *